(12) United States Patent
Geshel et al.

(10) Patent No.: US 9,141,730 B2
(45) Date of Patent: Sep. 22, 2015

(54) METHOD OF GENERATING A RECIPE FOR A MANUFACTURING TOOL AND SYSTEM THEREOF

(75) Inventors: Mark Geshel, Kfar Saba (IS); Avishai Bartov, Hod-Hasharon (IS)

(73) Assignee: Applied Materials Israel, Ltd., Rehovot (IL)

( * ) Notice: Subject to any disclaimer, the term of this patent is extended or adjusted under 35 U.S.C. 154(b) by 332 days.

(21) Appl. No.: 13/230,483

(22) Filed: Sep. 12, 2011

(65) Prior Publication Data

US 2013/0066454 A1 Mar. 14, 2013

(51) Int. Cl.
*G06F 19/00* (2011.01)
*G06F 17/00* (2006.01)
*G06F 17/50* (2006.01)
*G05B 19/418* (2006.01)

(52) U.S. Cl.
CPC .......... *G06F 17/50* (2013.01); *G05B 19/41865* (2013.01); *G05B 2219/32096* (2013.01)

(58) Field of Classification Search
CPC ............... G05B 19/41865; G05B 2219/32096; G06F 17/50
See application file for complete search history.

(56) References Cited

U.S. PATENT DOCUMENTS

| | | | | |
|---|---|---|---|---|
| 4,845,558 | A * | 7/1989 | Tsai et al. | 348/126 |
| 5,995,878 | A * | 11/1999 | Miyajima | 700/121 |
| 6,543,039 | B1 * | 4/2003 | Watanabe | 716/55 |
| 7,065,239 | B2 * | 6/2006 | Maayah et al. | 382/145 |
| 7,562,327 | B2 * | 7/2009 | Sekido et al. | 716/55 |
| 7,869,643 | B2 | 1/2011 | Litichever et al. | |
| 8,640,060 | B2 * | 1/2014 | Geshel | 716/54 |
| 2004/0223639 | A1 | 11/2004 | Sato | |
| 2005/0146714 | A1 * | 7/2005 | Kitamura et al. | 356/237.2 |
| 2008/0181484 | A1 * | 7/2008 | Litichever et al. | 382/145 |
| 2008/0250384 | A1 | 10/2008 | Duffy et al. | |
| 2013/0318485 | A1 | 11/2013 | Park et al. | |
| 2014/0050389 | A1 | 2/2014 | Mahadevan et al. | |

* cited by examiner

*Primary Examiner* — Kenneth M Lo
*Assistant Examiner* — Sunray R Chang
(74) *Attorney, Agent, or Firm* — Lowenstein Sandler LLP

(57) ABSTRACT

A computer creates a recipe for a manufacturing tool based on design data. The computer obtains the design data, which includes basic elements and hierarchical levels corresponding to the basic elements. The computer selects one or more basic elements of interest and generates one or more sets of simple array cells corresponding to a level of interest. The computer uses the sets of simple array cells to identify periodical areas in level-of-interest coordinates to enable automated recipe creation. The periodical areas are identified with respect to one or more basic elements.

20 Claims, 18 Drawing Sheets

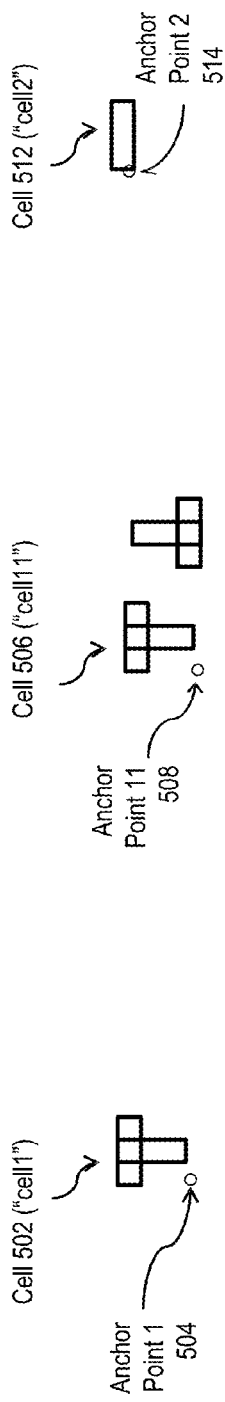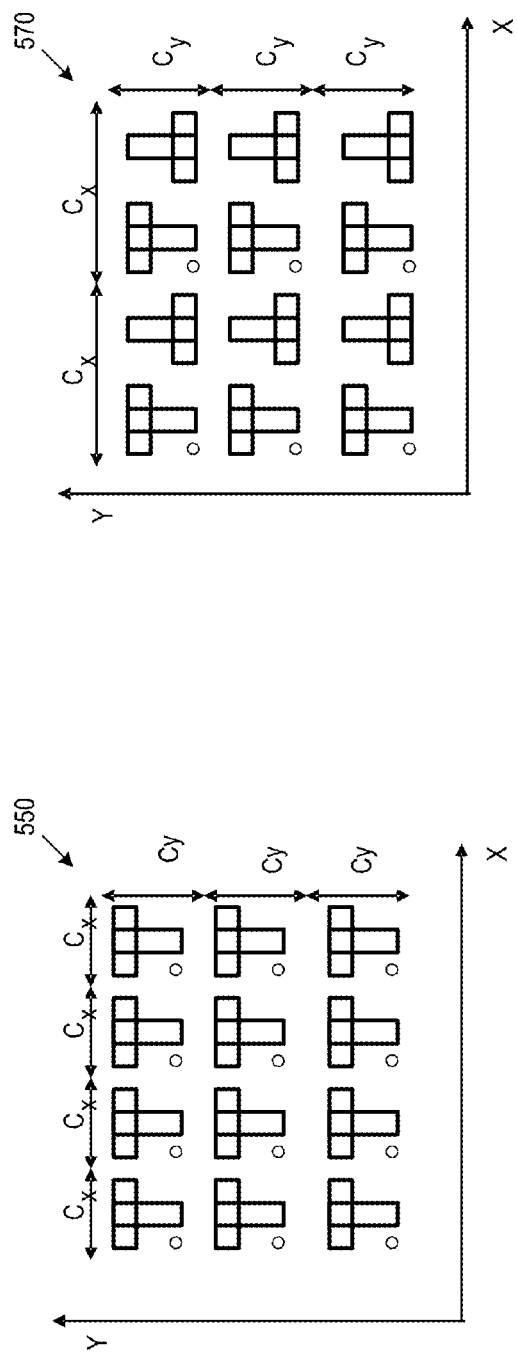

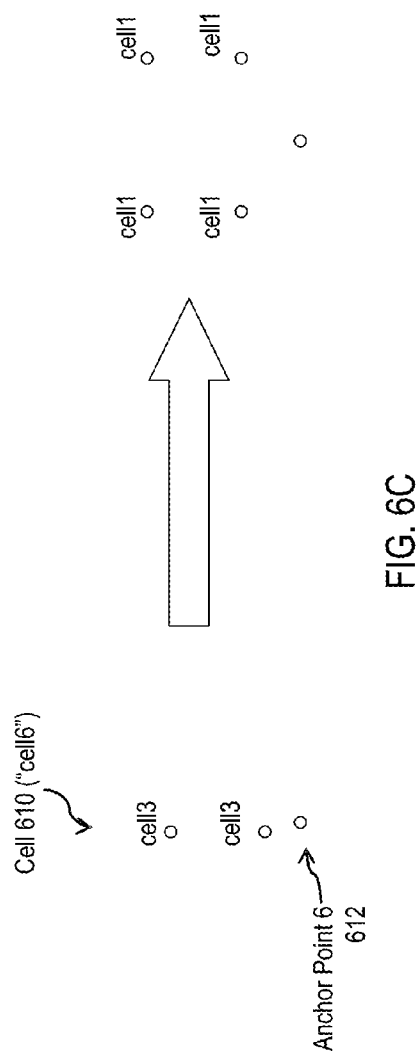

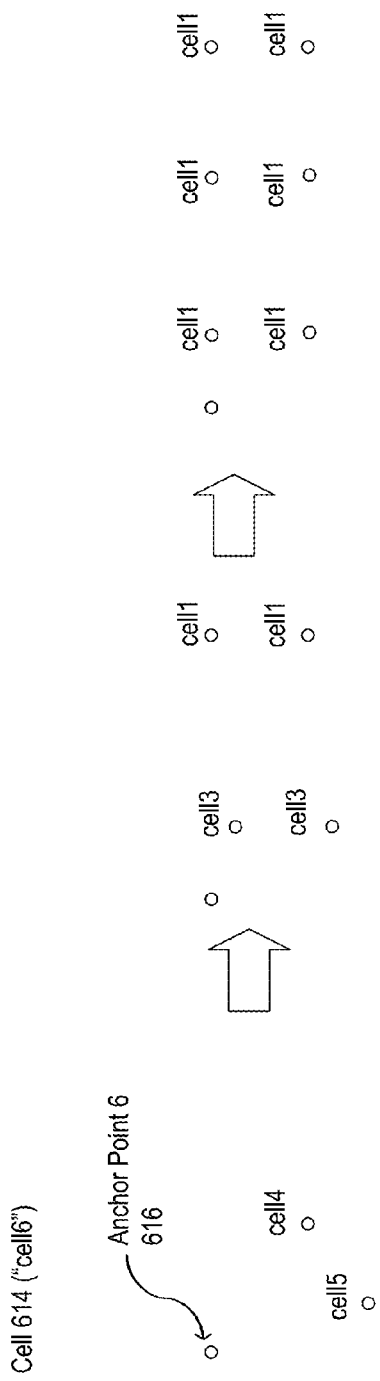
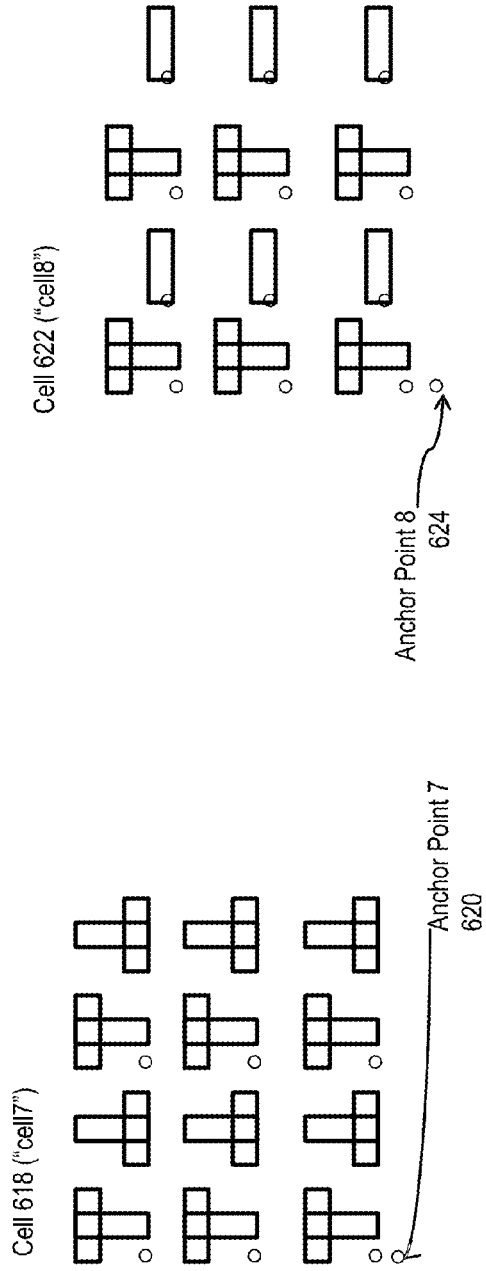
FIG. 6D
FIG. 6E
FIG. 6F

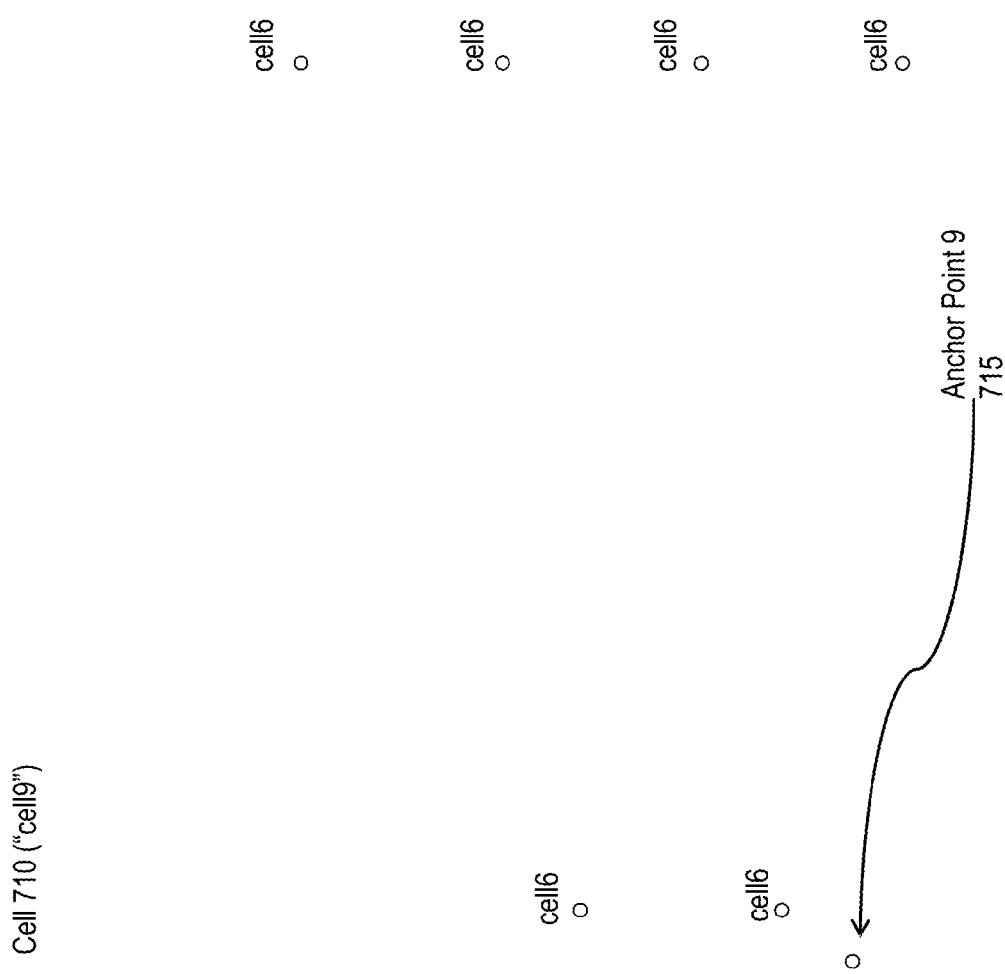

METHOD OF GENERATING A RECIPE FOR A MANUFACTURING TOOL AND SYSTEM THEREOF

FIELD OF THE INVENTION

The present invention relates, in general, to methods and systems for specimen manufacturing processes and, more particularly, to methods and systems of automated recipe generation using design data.

BACKGROUND OF THE INVENTION

In the semiconductor industry, devices are fabricated by a number of manufacturing processes producing structures of an ever-decreasing size. Thus, manufacturing processes, such as inspection, metrology, and review processes require increased precision and effectiveness for manufacturing specimens. The term "specimen" used in this specification should be expansively construed to cover any kind of wafer, reticle and other structures, combinations and/or parts thereof used for manufacturing semiconductor integrated circuits, magnetic heads, flat panel displays, and other thin film devices.

Manufacturing processes, such as inspection, metrology, and review of specimens, can include recognition of structural elements, measuring, calibration, monitoring, inspection, review and analyses of defects, reporting and/or other procedures necessary for evaluating parameters and/or conditions of respective manufacturing processes and providing necessary feedback. A variety of manufacturing tools can be based on non-destructive observations as, by way of non-limiting example, scanning electron microscopes, atomic force microscopes, optical inspection tools and others, and used for inspection, metrology, and review processes. As manufacture control requirements become more challenging, recipe generation for processes, such as inspection, metrology and review processes, has also become highly complex.

The volume of measurements and the complexity of recipes in state-of-the-art specimen manufacturing have made the conventional manual (or semi-manual) process of creating the recipes increasingly problematic. Emerging techniques of automated recipe generation can improve production time and development, and reduce chances of errors.

Problems of automated recipe generation have been recognized in the conventional art and various systems have been developed to provide solutions. For example, a conventional system for creating an inspection recipe includes an inspection target selection module selecting an inspection target; a critical area extraction module extracting corresponding critical areas for defect sizes in the inspection target; a defect density prediction module extracting corresponding defect densities predicted by defects to be detected in the inspection target for the defect sizes; a killer defect calculation module calculating corresponding numbers of killer defects in the defect sizes based on the critical areas and the defect densities; and a detection expectation calculation module calculating the number of killer defects expected to be detected for prospective inspection recipes determining rates of defect detection for the defect sizes, based on the number of killer defects and the rates of defect detection prescribed in the prospective inspection recipes.

Another conventional method for creating an inspection recipe includes acquiring a first design and one or more characteristics of output of an inspection system for a wafer on which the first design is printed using a manufacturing process. The method also includes creating an inspection recipe for a second design using the first design and the one or more characteristics of the output acquired for the wafer on which the first design is printed. The first and second designs are different. The inspection recipe will be used for inspecting wafers after the second design is printed on the wafers using the manufacturing process.

Conventional recipe generations solutions generate recipes based on wafers that have been produced. Traditional solutions rely on a first wafer to be manufactured, capture an image of the wafer, examine the produced wafer, and generate a recipe based on the analysis of the examined wafer. Typically, a user inputs data from the produced wafer to generate a recipe. Thus, the recipe generation process in existing solutions is a time consuming and cumbersome process.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIGS. 5A-5D illustrate non-limiting examples of schematic instances of basic cells and respective periodical arrays in accordance with certain embodiments of the presently disclosed subject matter;

FIGS. 6A-6F illustrate non-limiting examples of schematic instances of simple arrays in accordance with certain embodiments of the presently disclosed subject matter;

FIGS. 7A-7C illustrate non-limiting examples of schematic instances of aggregated periodical areas in accordance with certain embodiments of the presently disclosed subject matter;

DETAILED DESCRIPTION OF EMBODIMENTS

Embodiments of the invention are directed to a method and system for creating a recipe for a manufacturing tool. A computer creates a recipe for a manufacturing tool based on} design data. The computer obtains the design data, which includes basic elements and hierarchical levels corresponding to the basic elements. The computer selects one or more basic elements of interest and generates one or more sets of simple array cells corresponding to a level of interest. The computer uses the sets of simple array cells to identify periodical areas in level-of-interest coordinates to enable automated recipe creation. The periodical areas are identified with respect to one or more basic elements.

Embodiments of the invention significantly reduce the amount of processing time and the amount resources used to generate a recipe by using wafer-independent data. Rather than waiting for a wafer to be produced and examining and gathering data from a produced wafer, embodiments analyze design data to identify repetitive areas in the design data. The analysis of the design data can be done offline from a manufacturing process and in parallel to a manufacturing process. The analysis of the design data can be done in advance of producing a first wafer. Embodiments can use the results from identifying repetitive areas in the design data to generate a recipe, such as an inspection recipe, for a manufacturing tool. For example, the results from identifying repetitive areas in the design data can be used to determine whether to inspect a wafer using a cell-to-cell approach and/or a die-to die approach. For instance, when repetitive areas are identified in the design data, a recipe that applies a cell-to cell approach can be generated.

Embodiments enable a decision of whether to perform die-to-die inspection or cell-to-cell inspection to be made in an automatic manner by basing the decision on design data, rather than on data that is derived directly from a produced wafer. Embodiments further reduce the amount of processing time to generate a recipe by analyzing sets of simple array cells at different hierarchical levels, instead of analyzing sets of coordinates of all anchor points of a large number of basic cells. Embodiments further provide a more reliable process for creating a recipe. Conventional recipe generation solutions use data derived directly from a produced wafer, which contains errors, to generate a recipe. Embodiments use design data to create a recipe and enable a decision of whether to inspect a wafer using a cell-to-cell approach to be made without compensating for the errors that are usually associated with information derived from the wafer.

Figure 1:
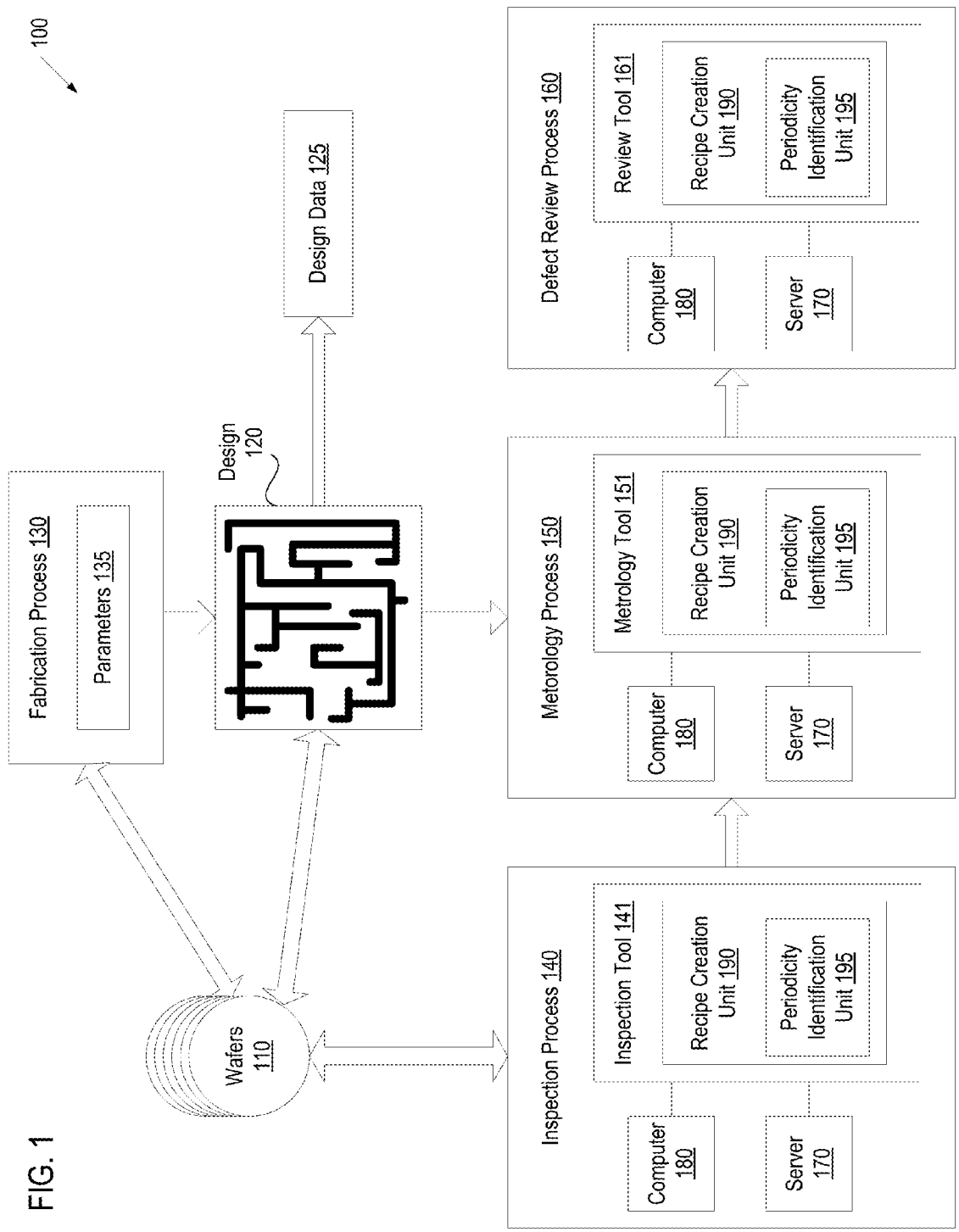
FIG. 1 illustrates an exemplary workflow for specimen design and fabrication, in accordance with embodiments of the invention.

FIG. 1 illustrates an exemplary workflow for specimen design and fabrication, in accordance with embodiments of the present invention. The term "specimen" used in this specification should be expansively construed to cover any kind of wafer, reticle and other structures, combinations and/or parts thereof used for manufacturing semiconductor integrated circuits, magnetic heads, flat panel displays, and other thin film devices. For brevity and simplicity, a wafer 110 is used as an example throughout this document. For purpose of illustration only, the following description is provided with respect to inspection of semiconductor wafers. Embodiments are applicable to other manufacturing operations and other specimens.

As illustrated, wafers 110 may be produced in accordance with a design 120, via a fabrication process 130 controlled by a set of process parameters 135. The design 120 can be stored, for example, in a CAD library in a data store. The design 120 can include a computer automated design (CAD) model for a specimen, for example, in a graphics from (such as GDS, GDS-II, and the like). The process parameters 135 may include a wide variety of parameters, for example, lithography parameters, etch parameters, and any other type of parameters. A data store can be a persistent storage unit. A persistent storage unit can be a local storage unit or a remote storage unit. Persistent storage units can be a magnetic storage unit, optical storage unit, solid state storage unit, electronic storage units (main memory), or similar storage unit. Persistent storage units can be a monolithic device or a distributed set of devices. A 'set', as used herein, refers to any positive whole number of items.

Figure 11:
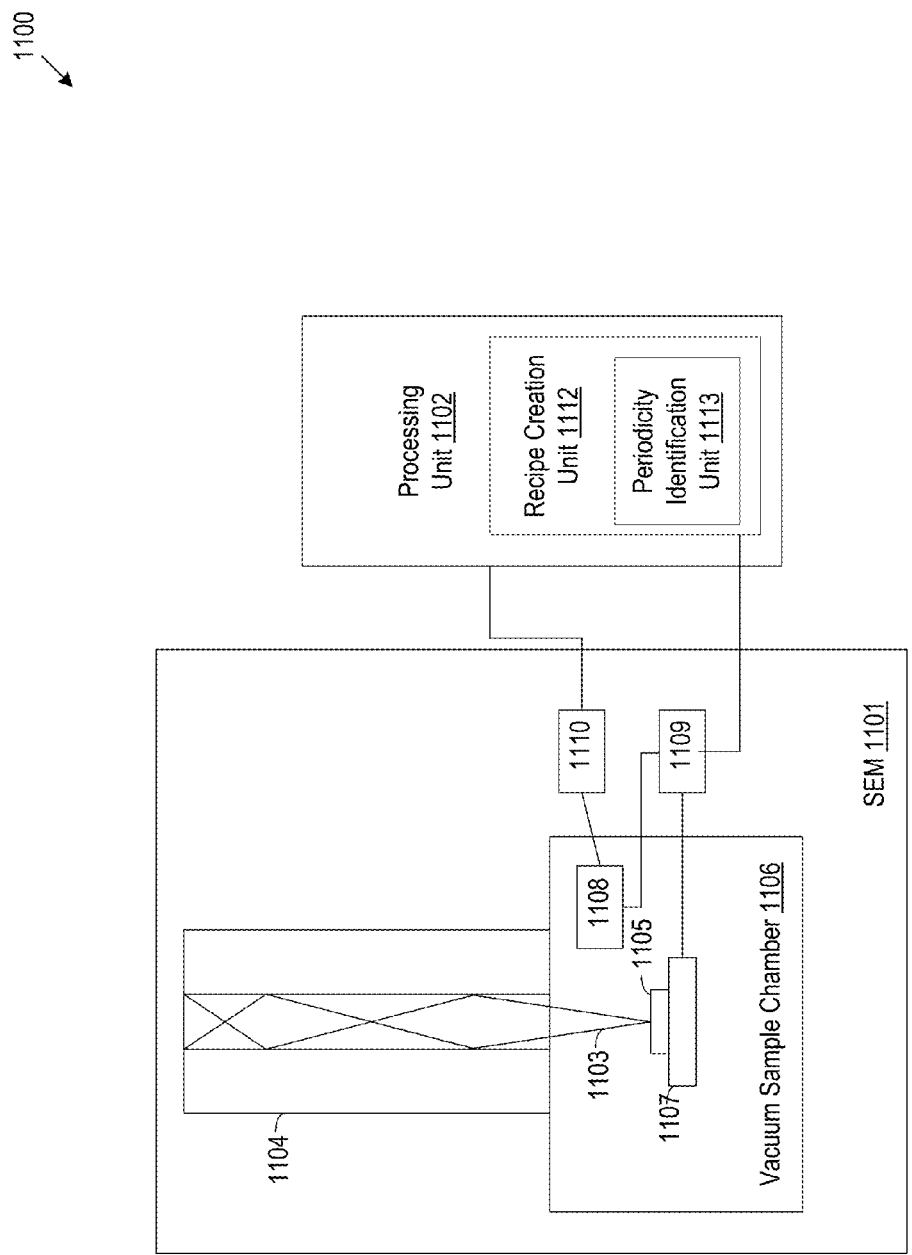
FIG. 11 illustrates a schematic functional diagram of a manufacturing tool.

The wafers 110 can undergo one or more manufacturing processes using one or more manufacturing tools. Examples of manufacturing processes can include, and are not limited to, a fabrication process 130, an inspection process 140, a metrology process 150, and defect review process 160. Examples of manufacturing tools can include, and are not limited to, an inspection tool 141, a metrology tool 151, a defect review tool 161, tools for the fabrication process, etc. FIG. 11 describes an exemplary manufacturing tool using a scanning electron microscope (SEM) in greater detail below.

As part of the inspection process 140, an inspection tool 141 can identify locations of defects in the wafers 110. The inspection process 140 may be performed using any suitable type defect inspection system, such as a Dark Field, Bright Field or E-Beam inspection system. While shown as a separate process in FIG. 1, the inspection process 140 may, in some cases, be performed inline with the fabrication process 130. As part of a metrology process 150, a metrology tool 151 can perform wafer measurement, such as measuring wafer bow, resistivity, wrap, site, flatness, and thickness. A metrology tool 151 can be used for testing, but can have other applications such as monitoring environmental parameters and provision of real-time data on acoustics, vibrations, and temperature in the lab. A metrology tool 151 can perform other tasks, such as holding, joining, separating, soldering, etc. An automated defect review process 160 can include a review tool 161 to process defect data in an effort to extract information that may be used to gain insight into design process. For example, the automated defect review process 160 may extract information leading to modifications to improve the design data 125 or adjusting the fabrication process 130 to improve the processes.

The inspection process 140 can identify the defects for the review process 160. Various inspection tools 141 may be utilized, including those in which a view of a wafer 110 (or other device or object) is compared to one or more reference views showing how the wafer 110 should appear in a defect-free state. A reference image or images may be used for the comparison. For example, a reference image may depict or may be based at least in part on other portion(s) of the same wafer that (ideally speaking) contain the same structural features.

Figure 2:
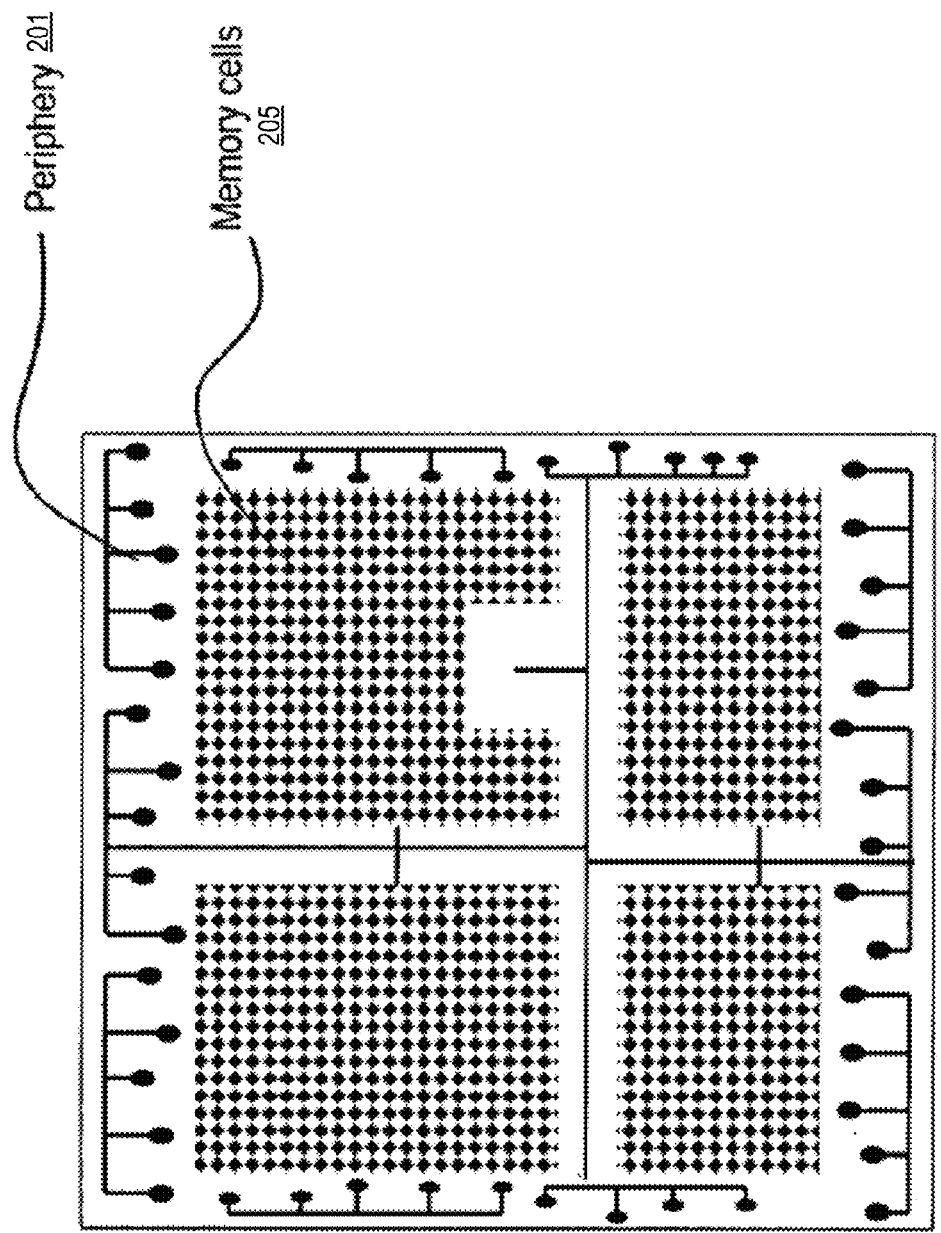
FIG. 2 is a diagram illustrating an exemplary component that can comprise one of many dies in a wafer.

Wafers 110 can be inspected using die-to-die comparison or cell-to-cell comparison. An image of a wafer 110 may be obtained and the cells or dies shown therein can be inspected using any combination of appropriate die-to-die or cell-to-cell inspection methods. For instance, an example of a component that may be included in a wafer 110 is shown in FIG. 2. For instance, the component shown in FIG. 2 may comprise one of many dies in a wafer 110. The component may include areas that are best inspected using die-to-die inspection, such as the periphery 201 area which may comprise, for example, logic components. Such areas may be checked for defects by comparison to one or more reference dies.

However, in other situations, cell-to-cell inspection may be desired. For example, the device shown in FIG. 2 includes a number of (ideally) identical memory cells 205 of one or more types in the interior. For such cells 205, cell-to-cell inspection may be preferable since adjacent or nearby cells within the same die may be more similar than cells between adjacent dies. The similarities may be due to process conditions and/or the inspection tool 141 itself. For instance, differences due to illumination, focus, or other optical irregularities may be less pronounced within a die as compared to between dies.

Returning to FIG. 1, inspection of wafers is provided in accordance with a manufacturing recipe (e.g., inspection recipe). As part of creating a recipe for inspection of a given wafer or layer of a wafer, a recipe can designate different areas of the wafer to different types of inspection. By way of non-limiting example, a recipe can designate areas as masked regions, die-to-die inspection regions, or cell-to-cell inspection regions. By way of non-limiting example, cell-to-cell inspection (i.e. inspection provided to periodical die areas with periodicity less than dies) can be preferable when adjacent or nearby areas within the same die are more similar than areas belonging to different dies. Some areas of a given wafer (e.g., periphery area comprising logic components) can be preferably inspected using a die-to-die method. Other areas (e.g., areas comprising pluralities of identical cells of one or more types) can be preferably inspected using a cell-to-cell method. Certain areas of wafers can be inspected using any appropriate combination of die-to-die and/or cell-to-cell inspection methods.

Regions of the wafer can be designated to a certain type of inspection in accordance with images (e.g., SEM images) of a semiconductor structure that are obtained using a manufacturing tool and/or based on non-image data, such as, for example, wafer design specifications.

In one embodiment, one or more manufacturing tools (e.g., inspection tool 141, metrology tool 151, review tool 161) can include a recipe creation unit 190 to generate a manufacturing recipe. The term "manufacturing recipe" or "recipe" used in the specification should be expansively construed to cover any settings of parameters specifying operation of one or more manufacturing tools (e.g. region-of-interest to be inspected, its location and repeat period on the wafer, the pixel size, beam current, charging conditions and image acquisition conditions, defect detection algorithm, image processing parameters, and/or others).

In another embodiment, one or more computers 180 can include a recipe creation unit 190 to generate a recipe for inspecting a wafer 110. A computer 180 can be coupled to one or more manufacturing tools (e.g., inspection tool 141, metrology tool 151, review tool 161). In one embodiment, a computer 180 communicates to the one or more tools via a network. In another embodiment, one or more servers 170 can include a recipe creation unit 190. A server 170 can be coupled to one or more manufacturing tools. A server 170 can be hosted by any type of computing device including server computers, gateway computers, desktop computers, laptop computers, hand-held computers or similar computing device. In one embodiment, the server 170 communicates to the one or more tools via a network (not shown). The network can be a local area network (LAN), a wireless network, a mobile communications network, a wide area network (WAN), such as the Internet, or similar communication system.

As part of generating an inspection recipe comprising cell-to-cell inspection, there is a need to recognize respective die partitions, i.e. to identify repetitive pattern areas and repetitiveness parameters thereof.

The terms "repetitive pattern area", repetitive area", "periodical pattern area" or "periodical area" used in the specification should be equally and expansively construed to cover any die area where the pattern is invariant under shift transformation with some shift value, i.e. is periodical regarding some periodicity value(s) (referred to hereinafter also as "repetitiveness parameter(s)).

Unlike conventional recipe generation solutions which rely for wafers to be produced and use data from the produced wafers to recognize respective die partitions for generating an inspection recipe, a recipe creation unit 190 can include a periodicity identification unit 195 to use design data 125 to identify periodical areas in the design data 125 for a wafer and a recipe can be generated based on the identified periodical areas from the design data 125 for a wafer. The design data 125 can be a subset of data that is stored in a CAD library and can be in a different format than the data that is stored in a CAD library. The design data 125 can be stored in a data store coupled to a periodicity identification unit 195.

The design data 125 can include basic elements and hierarchical levels corresponding to the basic elements. The periodicity identification unit 195 can select one or more basic elements of interest from the design data 125 and generate one or more sets of simple array cells to correspond to a level of interest. The periodicity identification unit 195 can use the one or more sets of simple array cells to identify periodical areas in level-of-interest coordinates in the design data 125 to enable automatic recipe creation. The periodicity identification unit 195 can identify the periodical areas with respect to one or more basic elements. A location of a certain periodical area can be defined in different coordinates (e.g., coordinate system characterizing the lowest layer of a wafer, coordinate system characterizing the top layer of a wafer, etc.)

A determination can automatically be made, for example, by a recipe creation unit 190, of whether to inspect wafers 110 using a die-to-die approach and/or a cell-to-cell approach. A cell-to-cell approach can be used if, for example, the periodicity identification unit 195 identifies a minimum number of periodical areas are present in the design data 125 for a wafer.

Figure 3:
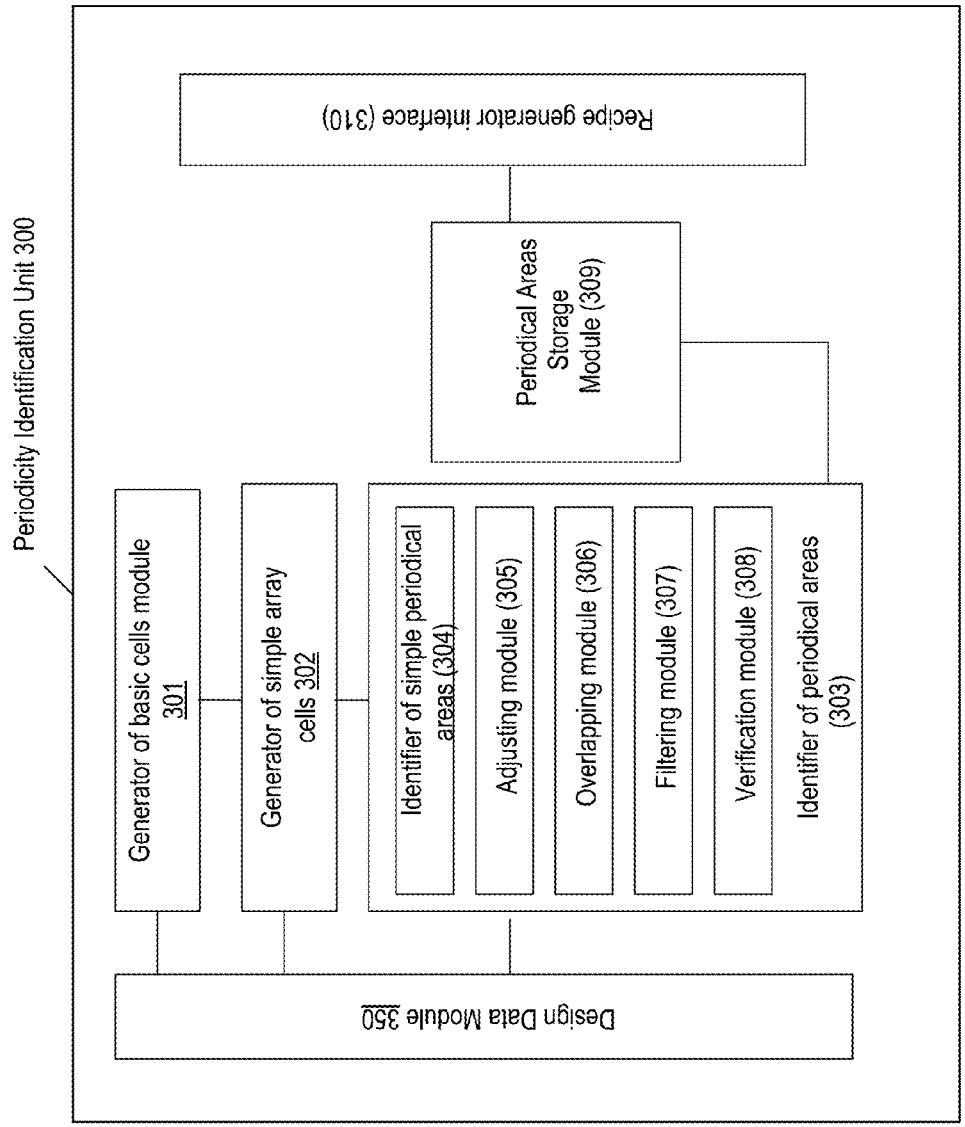
FIG. 3 illustrates a schematic functional diagram of a periodicity identification unit in accordance with certain embodiments of the presently disclosed subject matter.

FIG. 3 is a block diagram of one embodiment of a periodicity identification unit 300 for using design data to generate a recipe for a manufacturing tool. The periodicity identification unit 300 may be the same as the periodicity identification unit 195 in FIG. 1. The periodicity identification unit 300 comprises a design data module 350 configured to obtain and handle design data, to provide necessary transformation of design data (e.g., data in CAD library) coordinates, to identify cells corresponding to the design data, and to assign to the cells respective hierarchical levels. The design data module 350 is operatively coupled to a generator of basic cells 301, to a generator of simple array cells 302 and to identifier of periodical areas 303.

The generator of basic cells 301 is configured to enable a user and/or computerized process to define the basic elements of interest and to generate a respective set of basic cells. The generator of simple array cells 302 is operatively coupled to the generator of basic cells module 301 and configured to generate, in accordance with the set of basic cells, the set of simple array cells for the level of interest.

The identifier of periodical areas 303 is operatively coupled to the generator of simple array cells 302 and is configured to identify the final set of periodical areas (including periodicity values) using the set(s) of simple array cells. The final set of periodical areas is further stored and handled in a storage module 309 of periodical areas operatively coupled to the identifier of periodical areas 303. The storage module 309 can be a data store. A data store can be a persistent storage unit. A persistent storage unit can be a local storage unit or a remote storage unit. Persistent storage units can be a magnetic storage unit, optical storage unit, solid state storage unit, electronic storage units (main memory), or similar storage unit. Persistent storage units can be a monolithic device or a distributed set of devices. A 'set', as used herein, refers to any positive whole number of items. The identifier of periodical areas 303 can further comprise a generator of simple periodical areas 304 configured to identify in top-level coordinates periodical areas with respect to each basic cell; an adjusting module 305 configured to adjust the generated simple and/or aggregated periodical areas; an overlapping module 306 configured to identify overlapping between periodical areas corresponding to different basic cells and/or combinations thereof and to amend the periodical areas accordingly; a filtering module 307 configured to enable that periodical areas in the final set match a size-related criteria; and a verifying module 308 configured to enable repetitiveness of the generated periodical areas in view of repetitiveness breakers. Repetitiveness breakers are design data elements on the level-of-interest overlapping with a periodical area and not repetitive with the periodicity value of the periodical area.

The filtering module 307 can provide further filtering after the verification process. The filtering module 307 can filter out or remove periodical areas such that the final set of periodical areas satisfies size-related criteria. The criteria can be pre-defined and/or adapted per recipe purposes, filtering results, tool parameters, etc. The storage module 309 can be further configured to store data necessary for operation of modules 304-308 and the entire module 303, as well as to update the accommodated final set of periodical areas in accordance with data received from module 303. The storage module 309 is further operatively coupled to a recipe generator interface 310 enabling using the generated periodical area for further computerized recipe generation. By way of non-limiting example, the recipe generation interface can provide necessary rounding and/or multiplication of periodicity values in order to match requirements of a manufacturing tool (e.g., an inspection tool) and/or manufacturing process (e.g., inspection process).

Those versed in the art will readily appreciate that the teachings of the presently disclosed subject matter are not bound by the system illustrated in FIG. 3, equivalent and/or modified functionality can be consolidated or divided in another manner and can be implemented in any appropriate combination of software, firmware and hardware.

Figure 4:
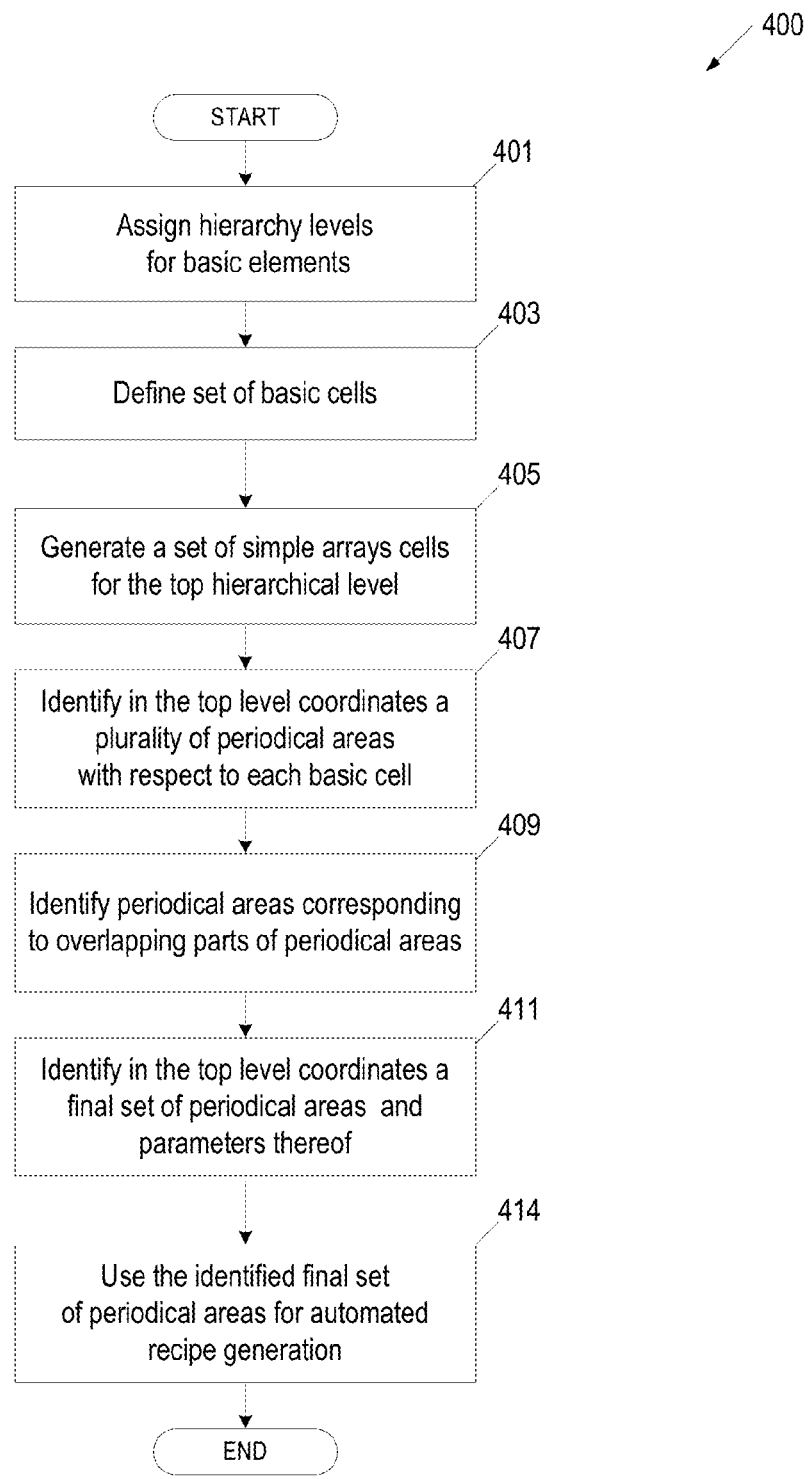
FIG. 4 illustrates a generalized flow chart of computerized recipe creation in accordance with certain embodiments of the presently disclosed subject matter.

FIG. 4 is a flow diagram of an embodiment of a method 400 for creating a recipe using design data in accordance with certain embodiments. Method 400 can be performed by processing logic that can comprise hardware (e.g., circuitry, dedicated logic, programmable logic, microcode, etc.), software (e.g., instructions run on a processing device), or a combination thereof. In one embodiment, method 400 is performed by a periodicity identification unit 195 in FIG. 1. The periodicity identification unit can be configured as a standalone tool to be used in conjunction with manufacture of a specimen or can be, at least partly, integrated with a processing unit. In one embodiment, initial die partitioning can be provided off-line, and further adjusted in accordance with a metrology tool and/or metrology process requirements.

The term "design data" used in the specification should be expansively construed to cover any data indicative of hierarchical physical design (layout) of a specimen and/or data derived from the physical design (e.g. through complex simulation, simple geometric and Boolean operations, etc.). Design data (e.g., design data 125 in FIG. 1) can be provided in different formats as, by way of non-limiting example, GDSII format, OASIS format, etc.

As known in the contemporary art, a structural element can be constructed as geometrical shapes or geometrical shapes combined with insertion of other structural elements. By way of non-limiting example, a given structural element can comprise one or more STRUCTURE elements inserted by means of SREF, AREF directives in GDSII format, or can comprise one or more CELL elements inserted by means of PLACEMENT and REPETITION (OASIS format).

A structural element with certain geometrical characteristics and corresponding to one or more geometrically identical structural elements (i.e. elements with the same dimensions, shape, orientation and design layer number) comprised in a design data library (or similar data structure) is referred to hereinafter as a "basic element".

For purpose of illustration only, the following description is provided with respect to basic elements characterized by an external rectangular boundary respectively parallel to an X and Y axis whose location (referred to hereinafter as an anchor point) selected as being in the low left corner of the rectangle. Those versed in the art will readily appreciate that the teachings of the presently disclosed subject matter are, likewise, applicable to other external boundaries, and/or other selection of anchor points.

A design library is constituted by structural elements which, in accordance with certain embodiments, the periodicity identification unit is configured to process to identify basic elements. A certain basic element is a "virtual structure" is not defined "per se" in the design library, but can correspond to one or more structural elements in the design library. The periodicity identification unit can obtain and analyze design data in order to identify all basic elements derived from the design data and corresponding to structural elements comprised in the design library. Geometrically identical elements with different names can be represented by the same basic element. The periodicity identification unit is further configured to assign to each basic element a respective hierarchical level value, and to assign, when appropriate, a parent-child relationship between the basic elements. Alternatively or additionally, the periodicity identification unit can obtain design data and/or derivatives thereof with already identified basic elements and the hierarchical levels corresponding to the identified basic elements.

At block 401, the periodicity identification unit assigns a hierarchical level to the basic elements as follows:
 a lowest hierarchical level ($H_0$) is assigned to the basic elements having no insertions of other basic elements;
 a next hierarchical level $H_1$ is assigned to the basic elements that have insertions of at least one basic element while all inserted elements belong to level $H_0$;
 hierarchical level $H_n$, is assigned to basic elements that have insertions of basic elements with hierarchical levels less or equal to n−1, while at least one inserted basic element has an $H_{n-1}$ hierarchical level.

An insertion is an operation on elements in CAD. An anchor point, also known as insertion point, is a characteristic of an insertion location.

Upon assigning hierarchical levels to the basic elements, the periodicity identification unit receives user input of a selection one or more basic elements assumed to compose (explicitly or implicitly by composing other structural elements of higher level(s)), the repetitive pattern areas to be inspected. The selected basic elements that cannot be decomposed in any other basic elements among the selected basic elements are referred to hereinafter as "basic cells". At block 403, the periodicity identification unit receives user input to define a set of basic cells of a specimen each characterized by respective hierarchical level Hi. FIG. 5A illustrates an exemplary set of three basic cells of a specimen. A basic cell 502 "cell" with anchor point 1 504 is composed of perpendicular rectangles constituting a T-shape. A basic cell 506 "cell11" is composed of a combination of a basic cell 502 cell1 and reflection of basic cell 502 cell 1 with anchor point 11 508. A basic cell 512 "cell2" is composed of a single rectangle with anchor point 2 514.

Different basic cells in the set can be characterized by different hierarchical levels. Alternatively or additionally, the user input can include one or more combinations of the basic cells (including results of their rotation and/or reflection). For example, basic cell 506 is a combination can be of a basic cell 502 and a reflection of a basic cell 502. Such combinations are also referred to hereinafter as basic cells. The hierarchical level of a combination of basic elements corresponds to the highest hierarchical level of a basic element among the elements in the combination.

Alternatively or additionally, the set of basic cells can be defined using a computerized process in accordance with a certain design and/or inspection related criteria. Alternatively or additionally, the basic cells can be defined using a computerized process in accordance with a user input (e.g. required hierarchical levels of basic cells, selection of an area supposedly comprising the basic cells of interest, etc.).

FIG. 5B illustrates a non-limiting example of a repetitive pattern area 550 of one or more basic cells to produce a periodical array. A repetitive pattern area 550 can be a rectangular area. A rectangular area constituted by a set of instances of a basic cell (e.g., cell 502 cell1) is further referred to as an M×N periodical array if coordinates of anchor points of the respective instances of the basic cell satisfy a repetitiveness criterion. In accordance with certain embodiments, the repetitiveness criterion can define requirements for coordinates of anchor points of instances of a given basic cell to determine whether a rectangular area having instances of a basic cell is a M×N periodical array. In accordance with certain embodiment, the repetitiveness criterion is as follows:

$$(X_m, Y_n) = (X_o, Y_o) + (m^*StepX, n^*StepY) \quad \text{(equation 1)},$$

where $(X_m, Y_n)$ are coordinates of respective anchor points in a coordinate system of the above rectangular area; m=0, 1, ..., M−1; n=0, 1, ..., N−1; and repetitiveness parameters StepX and StepY are positive constants.

The anchor points' coordinates of the instances of the basic cell 502 "cell1" in the repetitive pattern area 550 satisfy the repetitiveness criterion (eq. 1) with StepX=Cx and StepY=Cy ("Cx" denotes periodicity values in X direction, and "Cy" denotes periodicity values in Y direction). Accordingly, the illustrated set of basic cells 502 cell1 in repetitive pattern area 550 constitutes a 4×3 periodical array.

FIG. 5C illustrates another non-limiting example of a repetitive pattern area 570 of one or more basic cells to produce a periodical array. The anchor points' coordinates of the instances of basic cell 506 "cell11" in the repetitive pattern area 570 satisfy the repetitiveness criterion (eq. 1) with StepX=Cx and StepY=Cy. The sets of basic cell 506 cell11 in the repetitive pattern area 570 constitute a 2×3 periodical array.

Figure 5D:
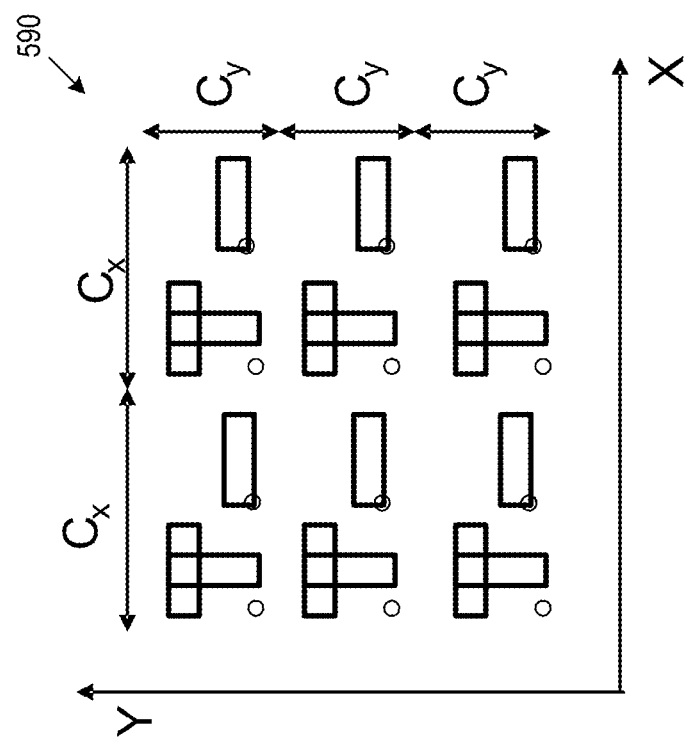

FIG. 5D illustrates yet another non-limiting example of a repetitive pattern area 590 of one or more basic cells to produce a periodical array. The coordinates of the insertions of the basic cell 502 "cell1" satisfy the repetitiveness criterion (eq. 1) with StepX=Cx and StepY=Cy. The coordinates of the insertions of the basic cell 512 "cell2" satisfy the repetitiveness criterion (eq. 1) with StepX=Cx and StepY=Cy. Accordingly, the repetitive pattern area 590 comprises a 2×3 periodical array of cell 502 and 2×3 periodical array of cell 2 512.

In general, repetitive pattern area(s) at a level of interest (referred to hereinafter as a top level) can be defined by analyzing a set of coordinates of all anchor points of each basic cell comprised in the design data to define the periodical areas, including explicit insertions of basic cells and implicit insertions (when a certain basic cell has been inserted into a cell of a higher level and its insertion coordinates have been, finally, transformed into top-level coordinates). However, such a set of coordinates can be of huge size and generation of the set and an attempt of a repetitiveness analyses can take an unreasonable amount of time.

In accordance with certain embodiments, instead of analyzing the set of coordinates of all anchor points of each basic cell in a repetitive pattern area, the periodicity identification unit generates and analyses simple arrays of the basic cells. The term "simple array of a given basic cell" used in this specification should be expansively construed to cover any set of insertions of this given basic cell characterized by that the coordinates of respective anchor points satisfy the repetitiveness criterion, i.e. the simple array of the given basic cell constitutes a repetitive pattern area with respect to the given basic cell. For example, if "CellB" comprises M×N periodical array of "CellA" insertions, then "CellB" comprises simple array of "CellA". Those versed in the art will readily appreciate that "CellA" can be also considered as a cell comprising 1×1 simple array of "CellA".

FIGS. 6A-6F are schematic instances of exemplary simple arrays. FIG. 6A illustrates cell3 602 comprising two insertions of cell1 in horizontal order. The cells are characterized by anchor point 604. These insertions satisfy the repetitiveness criterion and hence, cell 3 602 comprises a 2×1 simple array of cell1. FIG. 6B illustrates cell4 606 comprising two insertions of cell1 in vertical order. The cells are characterized by anchor point 608. These insertions satisfy the repetitiveness and, hence, cell 4 606 comprises a 1×2 simple array of cell1. FIG. 6C illustrates cell 6 610 comprising two insertions of cell 3 in vertical order. The cells are characterized by anchor point 612. The two insertions of cell 3 in vertical order correspond to four insertions of cell1, which satisfies the repetitiveness criterion for the insertions of cell1, and hence, cell 6 610 comprises a 2×2 simple array of cell1. FIG. 6D illustrates cell6 614 comprising one insertion of cell 5 and one insertion of cell4. Cell5 corresponds to two insertions of cell3. Cell4 corresponds to two insertions of cell1. The cells are characterized by anchor point 616. Each cell3 corresponds to two insertions of cell1 in a horizontal order, which satisfies the repetitiveness criterion insertions of cell1. Hence, cell6 614 comprises a 3×2 simple array of cell1. FIG. 6E illustrates cell7 618 comprising a 2×3 simple array of cell11. The cells are characterized by anchor point 620. FIG. 6F illustrates cell8 622 comprising a 2×3 simple array of cell1 and a 2×3 simple array of cell2. The cells are characterized by anchor point 624. As illustrated, the same cell can comprise simultaneously different simple arrays, corresponding to different basic cells. Those versed in the art will readily appreciate that upon rotations with angles divisible by 90° and/or reflections relatively to coordinate system axes, a given simple array will remain to be a simple array with modified repetitiveness parameters.

Referring back to FIG. 4, a basic element of hierarchical level Hk comprising a simple array of a basic cell is referred to hereinafter as a "simple array cell of hierarchical level Hk". A simple array cell comprises only one simple array of a given basic cell, while it can comprise several simple arrays corresponding to different basic cells. A given simple array cell is characterized by hierarchical level of the basic element and by repetitiveness parameters and basic cell(s) of respective simple array(s). A set comprising the simple array cells of hierarchical levels up to Hk and characteristics thereof is referred to hereinafter as a "set of simple array cells of hierarchical level Hk".

At block 405, the periodicity identification unit uses the defined sets of basic cells to generate a top-level set of simple array cells, the set comprising simple array cells up to the top hierarchical level (level of interest) and characteristics thereof. The generated set can comprise all such simple array cells or, alternatively, only simple array cells selected in accordance with a predefined criterion.

In accordance with certain embodiments, the top-level set of simple array cells can be generated as follows:

For a given basic cell characterized by hierarchical level Hi, the periodicity identification unit identifies all basic elements of Hi+1 hierarchical level comprising respective simple array and generates a set of simple array cells for level Hi+1. A cell simultaneously comprising multiple simple arrays corresponding to different basic cells of hierarchical level Hi (e.g. as illustrated by cell8 in FIG. 6F) can be included in the level Hi+1 set several times in accordance with each respective basic cell. The respective basic cells of hierarchical level Hi are also included in the set of simple array cells of Hi+1 hierarchical level, and the set of simple arrays of level Hi (if there were basic cells at levels less than Hi).

The periodicity identification unit further traverses design data from the bottom up, from level Hi+1 to the top level, and generates for each hierarchical level a respective set of simple array cells using a respective set generated at a previous level, thereby generating the top level set of simple array cells.

Thus, at each given hierarchal level, the set of simple array cells is generated by analyzing, merely, insertions of the cells from the simple array set generated for a respective previous level, thereby significantly reducing the required processing.

Optionally, at each hierarchical level, the procedure can include optimization of the generated set by excluding redundant cells, i.e. cells having child relationship merely with other cells within the simple array set of a respective level.

Those versed in the art will readily appreciate that in accordance with teachings of the presently disclosed subject matter, a certain basic element inserted at a given hierarchical level does not comprise a simple array of any basic cell if this certain basic element has not been included in the set of simple array cells of the given hierarchical level. Likewise, only basic elements comprised in the top-level set of simple array cells can comprise repetitiveness areas of interest.

At block 407, the periodicity identification unit further identifies, in the top level coordinates, periodical areas with respect to each basic cell. For each insertion of a cell comprised in the top-level set of simple array cells, the periodicity identification unit further transforms the repetitiveness parameters of respective simple array(s) in coordinates of a level corresponding to the simple array into parameters in coordinates of the top-level and identifies simple periodical areas. Each simple periodical area is defined in the top level coordinates by an external rectangular boundary of respective simple array.

Those versed in the art will readily appreciate that the top-level set of simple array cells can be identified in different manners. By way of non-limiting example, the method can comprise separately identifying top-level sub-sets of simple array cells corresponding to different basic cells with further optional merging. Alternatively or additionally, each top-level sub-sets of simple array cells can be used for identifying respective periodical areas with further merging the generated periodical areas.

The periodicity identification unit further aggregates adjacent simple periodical areas corresponding to the same basic cell into aggregated periodical areas. Whenever possible, the aggregated periodical areas include several simple periodical areas, but still in some cases, the aggregated periodical area can comprise only a single simple periodical area.

The periodicity identification unit further adjusts (expands or shrinks) the aggregated periodical areas, and generates an adjusted boundary of each aggregated periodical area so that the respective external rectangular boundary is expanded (or shrunken) by values (Cx−BoxX) and (Cy−BoxY) from both sides in X and Y directions respectively, where Cx—periodicity value in X direction, Cy—periodicity value in Y direction, $Box_X$, $Box_Y$—respectively, X and Y sizes of the bounding box of the respective basic cell. When the periodical area corresponds to one-dimension array(s), the size of the area in the second direction is defined, respectively, as $Box_X$ or $Box_Y$.

Figure 7B:
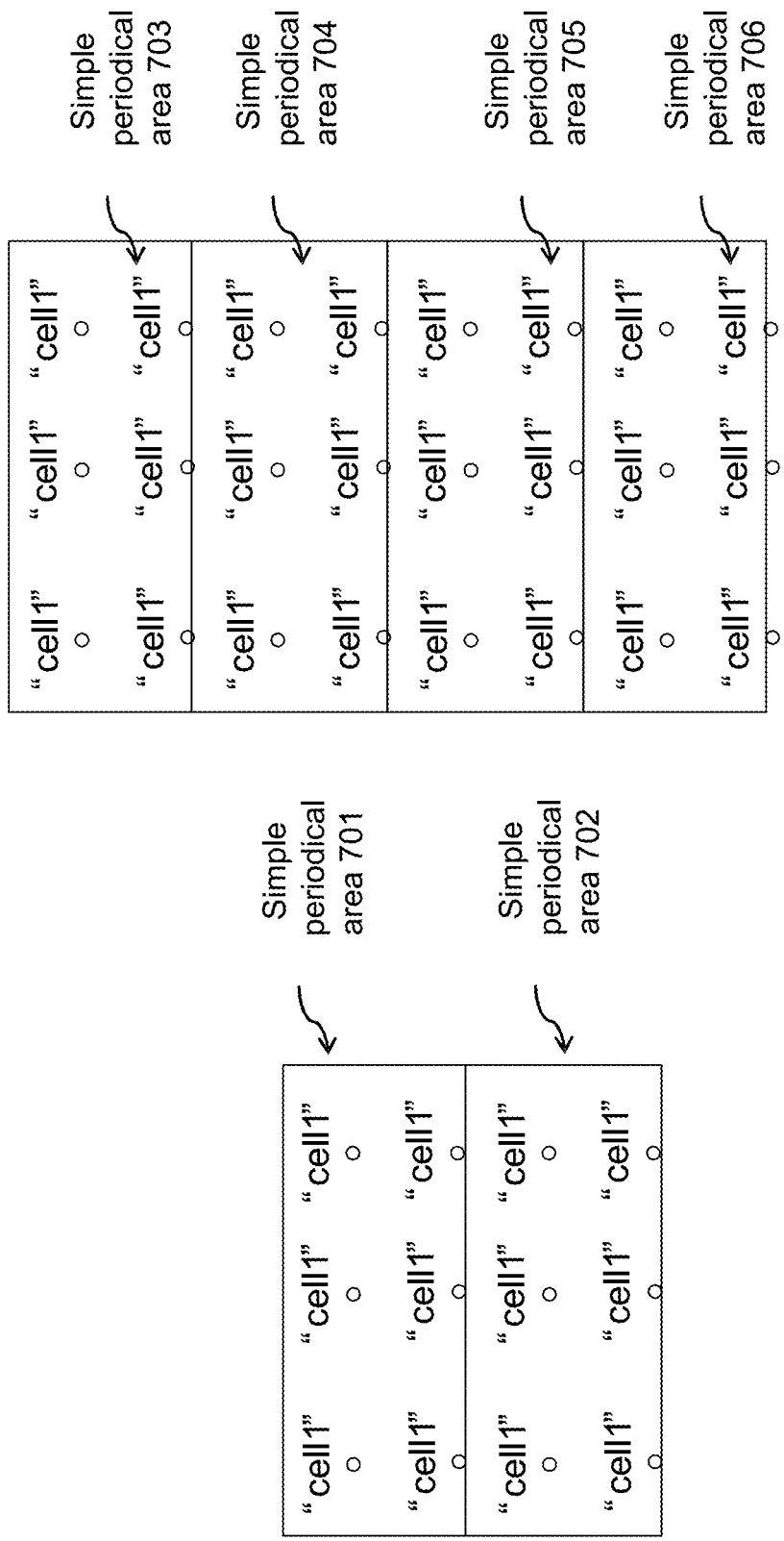
Figure 7C:
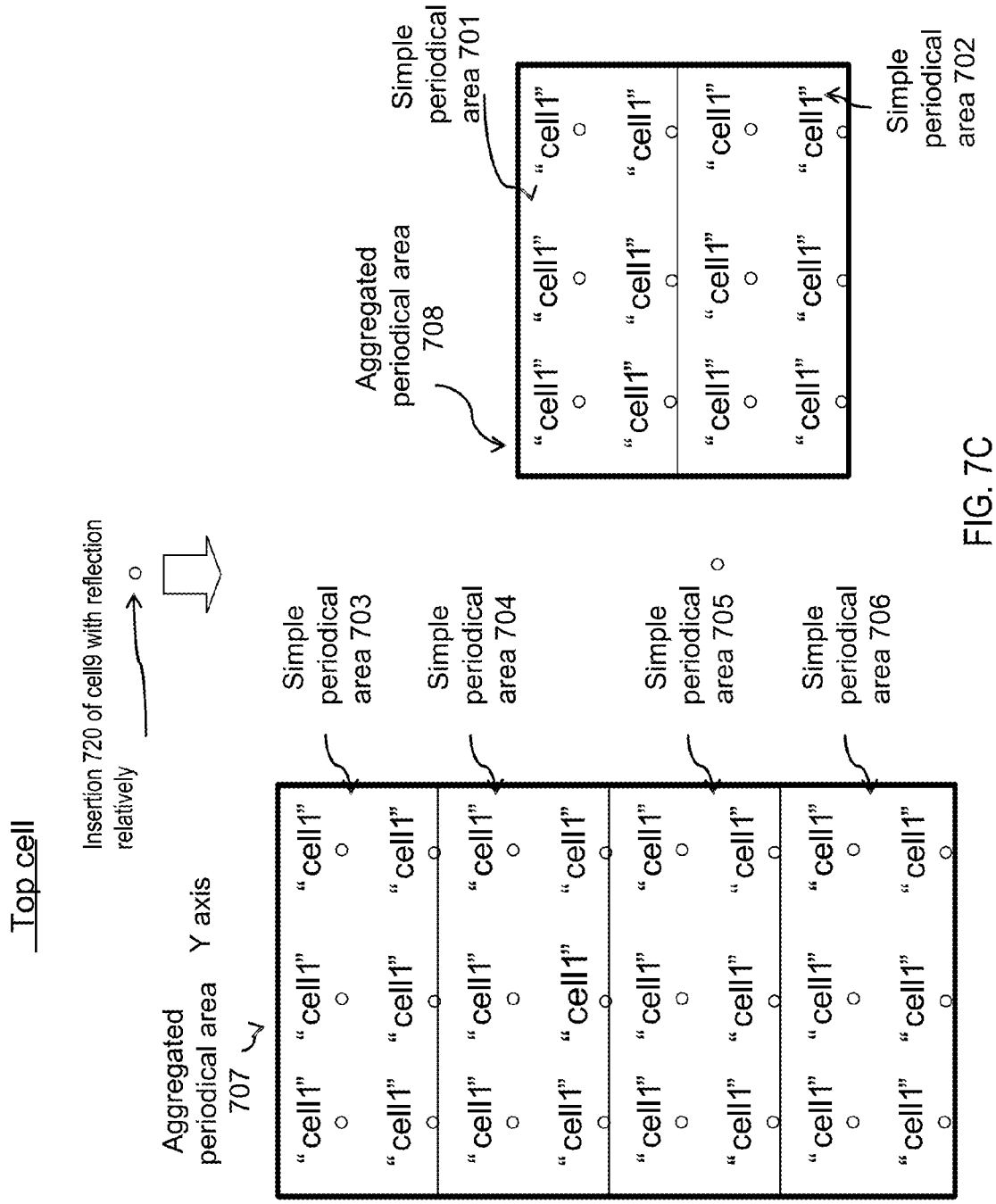

FIGS. 7A-7C are schematic instances of exemplary aggregated periodical areas. FIG. 7A illustrates cell 710 "cell9" comprising six insertions of cell6. The cells are characterized by anchor point 715. Accordingly, as illustrated in FIG. 7B, since each cell6 comprises 3×2 simple array of cell1, cell9 comprises six simple arrays of cell1. However, cell 9 is not constituted by a simple array of cell1, because 36 insertions of cell1 into cell9, combined together, do not match the repetitiveness criterion.

FIG. 7C illustrates insertion of cell9 in a top-level cell. The insertion 720 of cell9 is provided with reflection regarding the Y-axis. Those versed in the art will readily appreciate that upon rotations with angles divisible by 90° and/or reflections relatively to coordinate system axes, a given simple periodical area will remain to be a simple periodical area with modified repetitiveness parameters. Accordingly, six insertions of simple arrays of cell1 constitute simple periodical areas 701-706, each defined in the top level coordinates by external rectangular boundary of a respective simple array. Upon testing whether the periodicity criterion (e.g., repetitiveness criterion) is satisfied, adjacent simple periodical areas 701-702 are further aggregated into the aggregated periodical area 708 and adjacent simple periodical areas 703-706 aggregated into the aggregated periodical area 707 are defined by external boundaries of respective aggregated arrays.

Figure 8A:
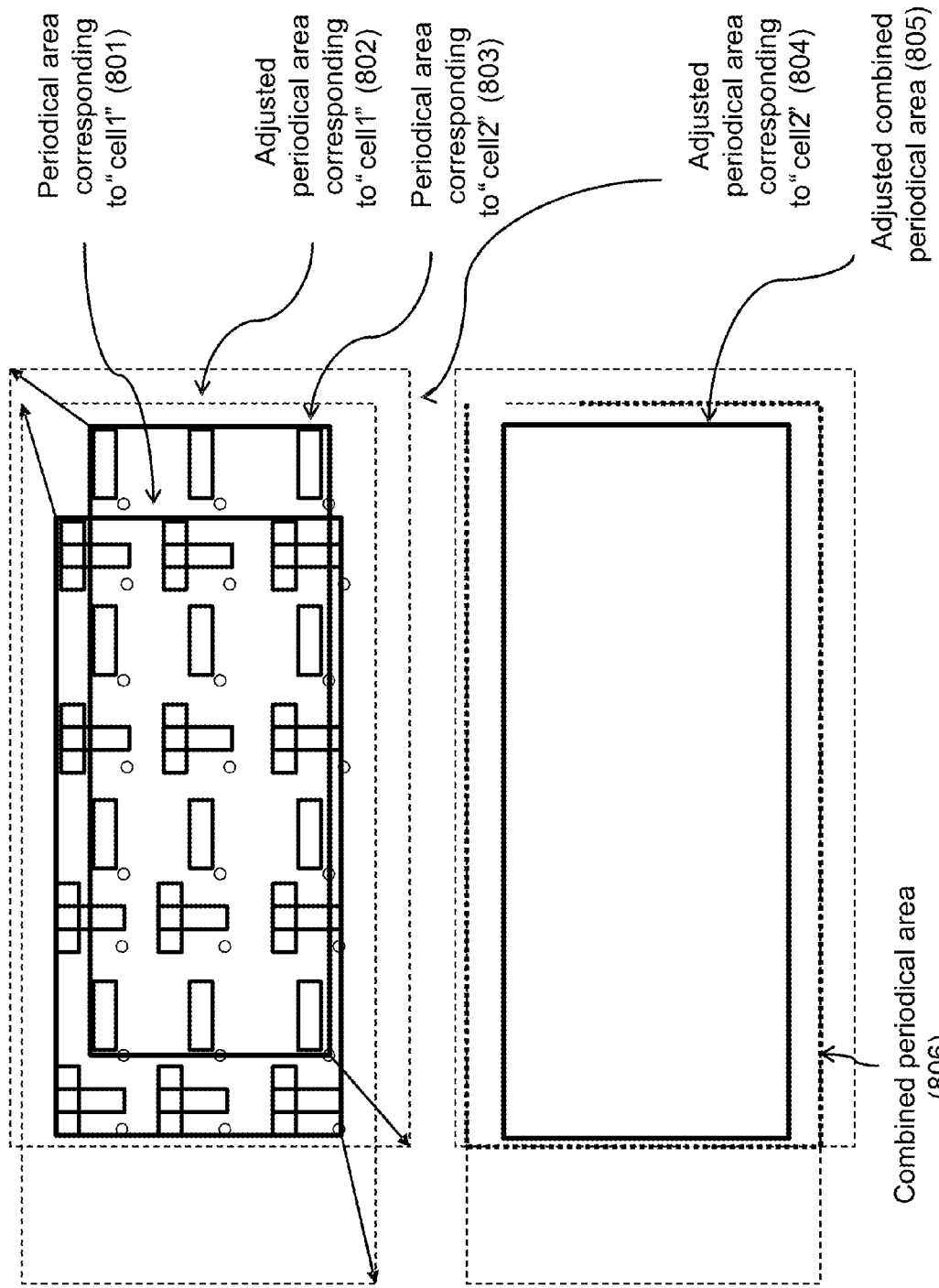
FIGS. 8A-8C illustrate non-limiting examples of schematic instances of overlapping periodical areas in accordance with certain embodiments of the presently disclosed subject matter.

FIG. 8A illustrates an exemplary periodical area (801) and an exemplary adjusted periodical area (802) corresponding to the basic cell1. FIG. 8A also illustrates an exemplary periodical area (803) and an exemplary adjusted periodical area (804) corresponding to the basic cell2. As illustrated, the periodical areas corresponding to different basic cells overlap.

Referring back to FIG. 4, at block 409, the periodicity identification unit is further operable to identify overlapped parts between aggregated periodical areas and to identify, when possible, corresponding combined periodical areas. Upon identifying a pair of overlapped periodical areas (e.g. corresponding to two different basic cells or to the same basic cell), the periodicity identification unit analyses periodicity values characterizing these periodical areas. If a value Ca of repetitiveness parameters of one of the areas in X or Y direction is divisible by a value Cb (or another common multiple) of respective repetitiveness parameter of another area without remainder, the overlapped parts of two adjusted areas are aggregated into a combined repetitive area, wherein Ca characterizes the repetitiveness of the resulted combined area in the respective direction with regard to the combination of respective basic cells, and the boundary of the combined area is defined by rectangular boundary of the overlapped area. The combined area can be further adjusted such that the adjusted boundary rectangle of the combined area is located within the boundaries of original areas.

In the non-limiting example illustrated in FIG. 8A, illustrated periodical areas 801 and 803 overlap, and values Cx1 and Cy1 of repetitiveness parameters of periodical area of cell1 for X and Y directions are divisible (equal) by values Cx2 and Cy2 of repetitiveness parameters of periodical area of cell2. Accordingly, the periodical areas 801 and 803 have been combined in X and Y directions into the periodical area 806 characterized by repetitiveness parameters Cx1 and Cy1 with respect to the combination of the basic cells cell1 and cell2, while the combined periodical area comprises all cells from the periodical areas 801 and 803. The periodical area 806 has been further adjusted to the periodical area 805.

Figure 8B:
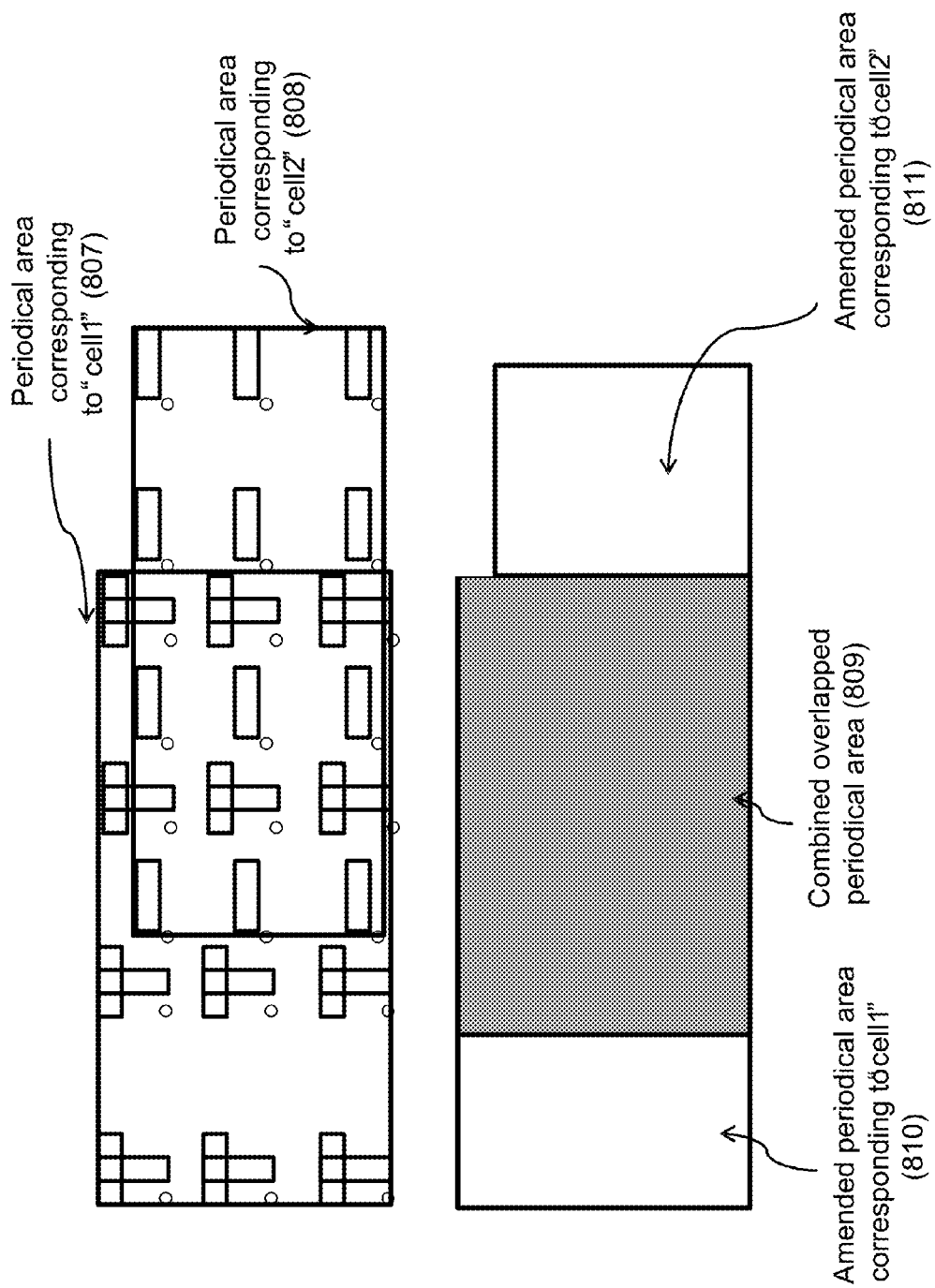

In the non-limiting example illustrated in FIG. 8B, illustrated periodical areas 807 and 808 partly overlap, and values Cx1 and Cy1 of repetitiveness parameters of periodical area of cell for X and Y directions are divisible (equal) by values Cx2 and Cy2 of repetitiveness parameters of periodical area of cell2. Accordingly, the overlapped parts of the periodical areas 807 and 808 have been combined in X and Y directions into the periodical area 809 characterized by repetitiveness parameters Cx1 and Cy1 with respect to the combination of the basic cells cell1 and cell2. The periodical area 807 has been amended into the periodical area 810, and the periodical area 808 has been amended into the periodical area 811. A periodical area can be amended by removing overlapping areas.

Referring back to FIG. 4, at block 411, the periodicity identification unit is further operable to identify the final set of repetitive areas. For each pair of overlapping aggregated periodical areas, the periodicity identification unit amends the aggregated periodical areas corresponding to respective basic cells to exclude the overlapped areas and generates, when possible, combined repetitive area(s). Likewise, for other pairs of periodical areas (aggregated/combined, combined/combined), the periodicity identification unit amends the corresponding periodical areas to exclude the overlapped areas and generates, when possible, combined repetitive area(s). The process is repeated for all overlapping pairs until there exists no overlapping between periodical areas. Resulted amended aggregated periodical areas and the combined repetitive areas constitute the final set of periodical areas identified by the periodicity identification unit.

Figure 8C:
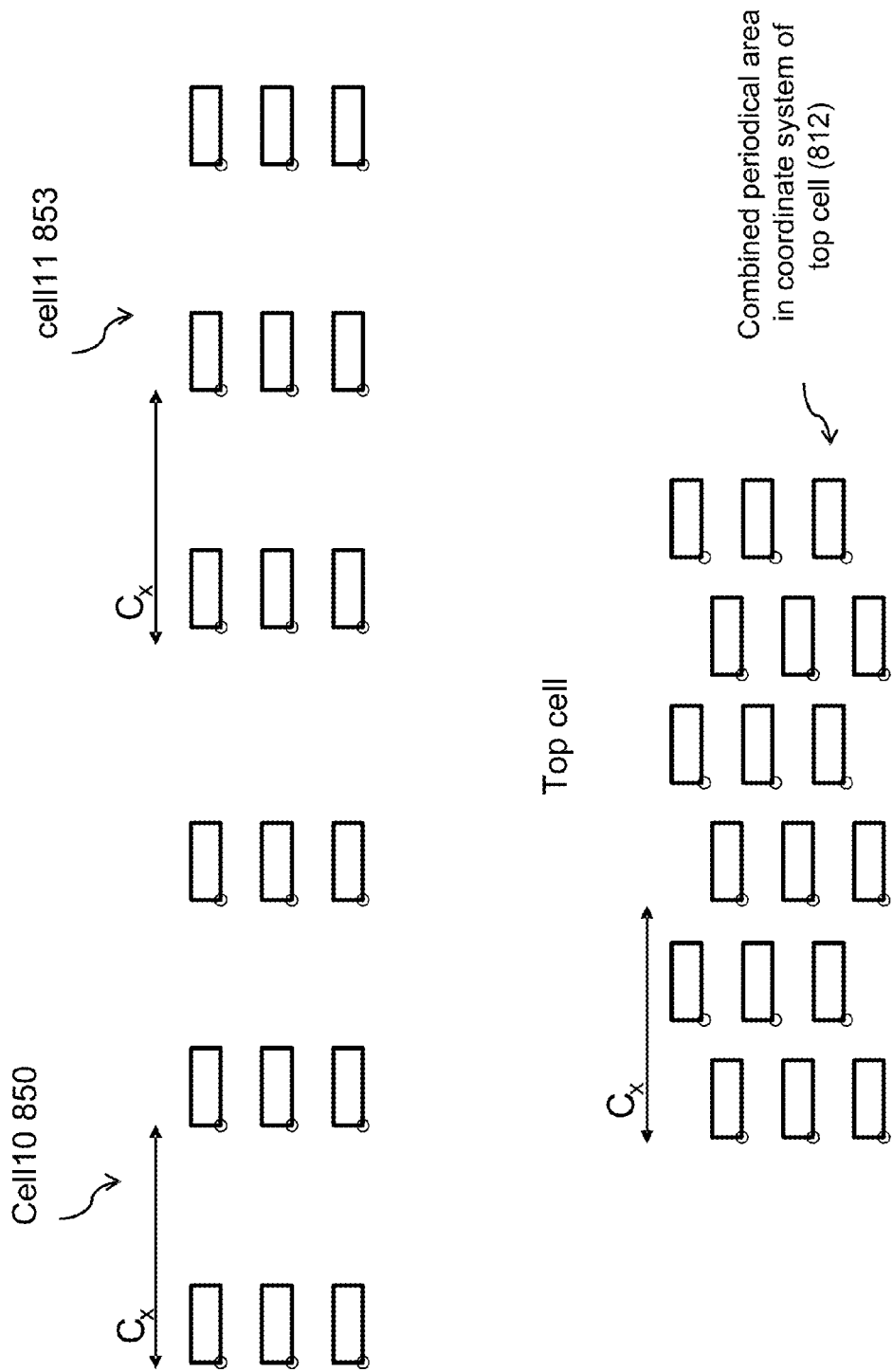

Those versed in the art will readily appreciate that the disclosed subject matter is not bound by handling the overlapping areas as described above. Likewise, by way of non-limiting example, the teachings are applicable when the number of adjusted and combined overlapped periodical areas is not limited by two areas. By way of another non-limiting example, the disclosed teachings are applicable when the basic cells are overlapped between themselves constituting a chessboard-like structure illustrated in FIG. 8C. As illustrated, a cell10 850 comprising 3×3 simple array of cell 2 with periodicity value Cx in X direction overlap in top-level coordinate system with cell 11 853 also comprising 3×3 simple array of cell 2 with periodicity value Cx. These two cells can be combined in periodical area 812. Optionally, a periodical area can be included in the final set of periodical areas only if matching a size-related criterion. By way of non-limiting example, the size-related criterion can be defined in accordance with the real size of the basic elements which can differ from design data size. Alternatively or additionally, the size-related criterion can be defined in accordance with inspected stage of the manufacturing process (e.g. if mask dimensions of a die are scaled (e.g. as 4:1) relative to the dimensions of the die on a wafer, then minimal size of periodical areas for mask inspection may be different than minimal area size for wafer inspection). Alternatively or additionally, the size related criterion can also depend on a scale characterizing manufacturing and/or inspection process.

The final set of periodical areas further comprises periodicity values characterizing the respective periodical areas. Those versed in the art will readily appreciate that if Ca is a periodicity value of a periodical area then value k*Ca, where k is any positive integer number, can be also assigned as periodicity value of this periodical area.

Figure 9A:
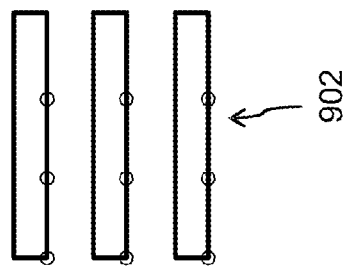
FIGS. 9A-9B illustrate non-limiting examples of schematic instances of further adjusting the periodicity values in accordance with certain embodiments of the presently disclosed subject matter.
Figure 9B:
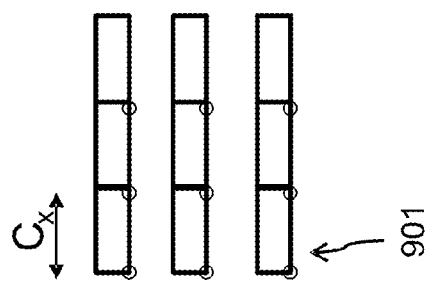
Figure 9B:
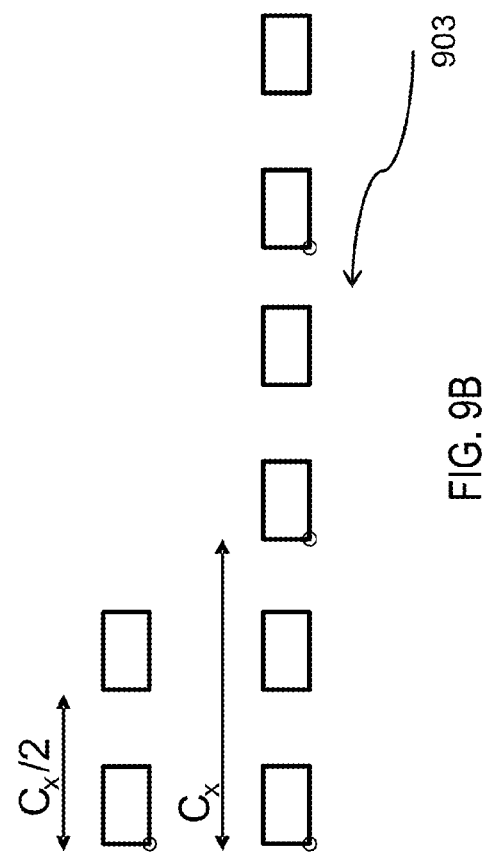

Generally, assigning of smaller periodicity value is preferable. Optionally, as illustrated by way of non-limiting examples in FIGS. 9A-9B, in some cases periodicity value defined by shift between anchor points of two neighboring basic cells can be further reduced (or otherwise adjusted) after additional analysis of cells' pattern and/or their relative location. The periodical area 901 illustrated in FIG. 9A comprises 3×3 periodical array of cell2 with periodicity value Cx, wherein cells neighboring in X direction have common boundaries. The periodical area 902, derived from the periodical area 901 by OR operation, comprises one-dimensional array 1×3 which can be characterized in X direction by any appropriate periodicity value in a range (0, 3Cx). Cell "cell12" 950 illustrated in FIG. 9B comprises two rectangles with Cx/2 shift in X direction. Accordingly, the periodical area 903 comprising 3×1 array of cell12 with periodicity value Cx can be characterized, upon analyses of cell12 pattern, by periodicity value Cx/2.

Those versed in the art will readily appreciate that generating the final set of periodical areas is not bound by the sequence of operations detailed with reference to block 409 and block 411. Optionally, a final set of periodical areas can be generated in 2 steps: off-line step generating a set comprising aggregated periodical areas and the combined repetitive areas, and an on-line step provided during inspection and comprising tuning this set in accordance with inspection tools and inspection requirements. By way of non-limiting example, a tool operating merely in Y direction cannot inspect an area with periodicity only in X direction, hence such areas shall be filtered out during the on-line step of recipe-creation.

Periodicity of a certain area depends not only on repetitiveness of the basic cells, but also on other design elements which correspond to non-repetitive pattern within the area and break its repetitiveness (e.g. non-repetitive boundary, path, SREF elements in case of GDSII format; rectangle, polygon, path, trapezoid, etc. elements in case of OASIS format, etc.) Accordingly, the periodicity identification unit can be further operable to verify the repetitiveness of the generated periodical areas in view of repetitiveness breakers.

Figure 10:
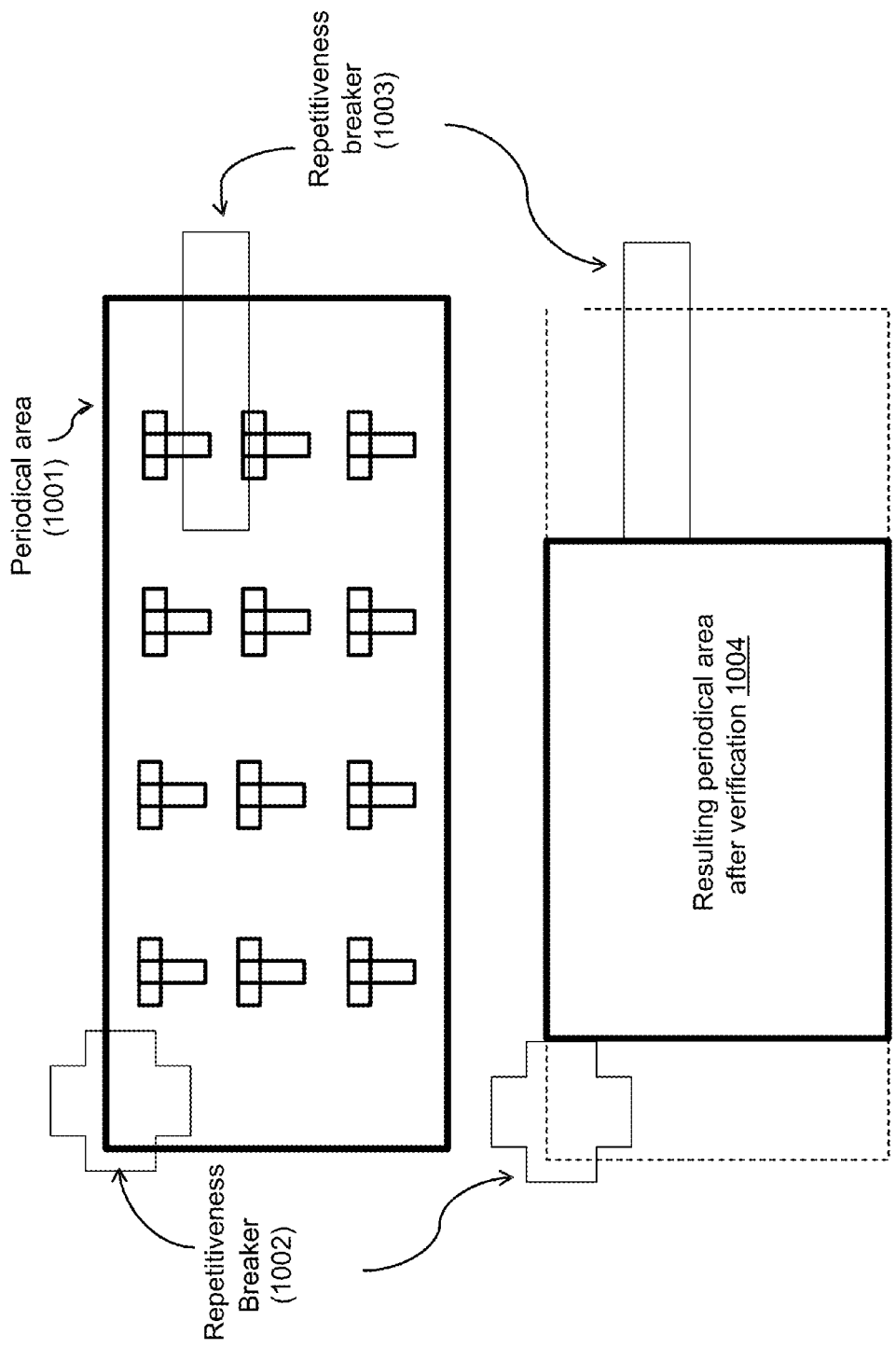
FIG. 10 illustrates non-limiting examples of schematic instance of a periodical area with repetitiveness breakers in accordance with certain embodiments of the presently disclosed subject matter.

For each periodical area in the final set of periodical areas (and/or in the simple periodical areas), the periodicity identification unit analyses design data in order to identify all repetitiveness breakers within the periodical area. For example, the periodicity identification unit can consider the periodical area as a clipping rectangle and use the design data to collect all structure elements overlapping with the rectangle, excluding the basic cells. If collected, the periodicity identification unit further identifies these structure elements (or, optionally, part thereof matching a predefined criteria) as repetitiveness breakers. Upon identifying the repetitiveness breakers, the periodicity identification unit shrinks the periodical area rectangle in such a way that all repetitiveness breakers will not overlap with the shrunk area and updates the final set of periodical areas. Optionally, if the shrunken area does not match size-related criterion, the respective periodical area can be excluded from the final set. A non-limiting example of a periodical area 1001 comprising repetitiveness breakers 1002 and 1003 is illustrated in FIG. 10. Upon shrinking, the periodical area 1004 does not comprise repetitiveness breakers.

Returning to FIG. 4, at block 414, the periodicity identification unit uses final set of periodical areas for automated recipe generation. The periodicity values characterizing the respective periodical areas are further translated in real-size values in accordance with scale factor characterizing relationship between design data and wafer (or mask or other layer generated in the manufacturing process). The real-size value can be further adjusted in accordance with a given metrology tool and/or inspection process (e.g. multiplied in order to match the respective size of pixels, round to in order to match the respective size of pixels, and/or otherwise).

FIG. 11 illustrates a schematic functional block diagram of an exemplary manufacturing tool 1100. For purpose of illustration only, FIG. 11 illustrates a manufacturing tool 1100 based on a scanning electron microscope (SEM) 1101. Manufacturing tool can be based on, by way of non-limiting example, optical inspection tools, atomic force microscopes and others. The manufacturing tool 1100 can include a SEM 1101 and a processing unit 1102. The SEM 1101 can use a beam 1103 of electrons which can be shaped and focused by a lens system using magnetic and electrostatic "lenses" (not shown) within an electron column 1104. The lens system can be designed to control the trajectory and focal length of the beam 1103 such that the electron beam focuses on a semiconductor structure 1105 placed in a vacuum sample chamber 1106. The vacuum sample chamber 1106 can include a X-Y stage 1107 and a secondary electron detector 1108. The X-Y stage 1107 can be adapted to move in an optional direction on a X-Y plane responsive to a control signal received from a control unit 1109. The secondary electron detector 1108 can be adapted to detect secondary electrons, reflected electrons and/or back scattered electrons emitted from the surface of the semiconductor structure 1105 irradiated with the electron beam 1103, and to provide the detected results to an image processing unit 110 1110. The image processing unit 1110 can be configured to receive the detected results of the secondary electron detector 1108 and to process the received data to provide a SEM image. The SEM image can be sent to the processing unit 1102 for further analyses to derive metrology data and store the SEM image and/or derivatives thereof. Optionally, the control unit 1109 can be further operatively coupled to the secondary electron detector 1108 and the processing unit 1102. The processing unit 1102 can be further configured to accommodate or store one or more manufacturing recipes (e.g., inspection recipe for inspecting a wafer). A manufacturing recipe can be initially generated off-line and further adjusted to a given manufacturing tool and/or process. The processing unit 1102 can further provide instructions to the control unit 1109 in accordance with the appropriate manufacturing recipe.

The processing unit 1102 can include a recipe creation unit 1112 having a periodicity identification unit 1113 to identify periodical areas using design data to generate a manufacturing recipe.

Figure 12:
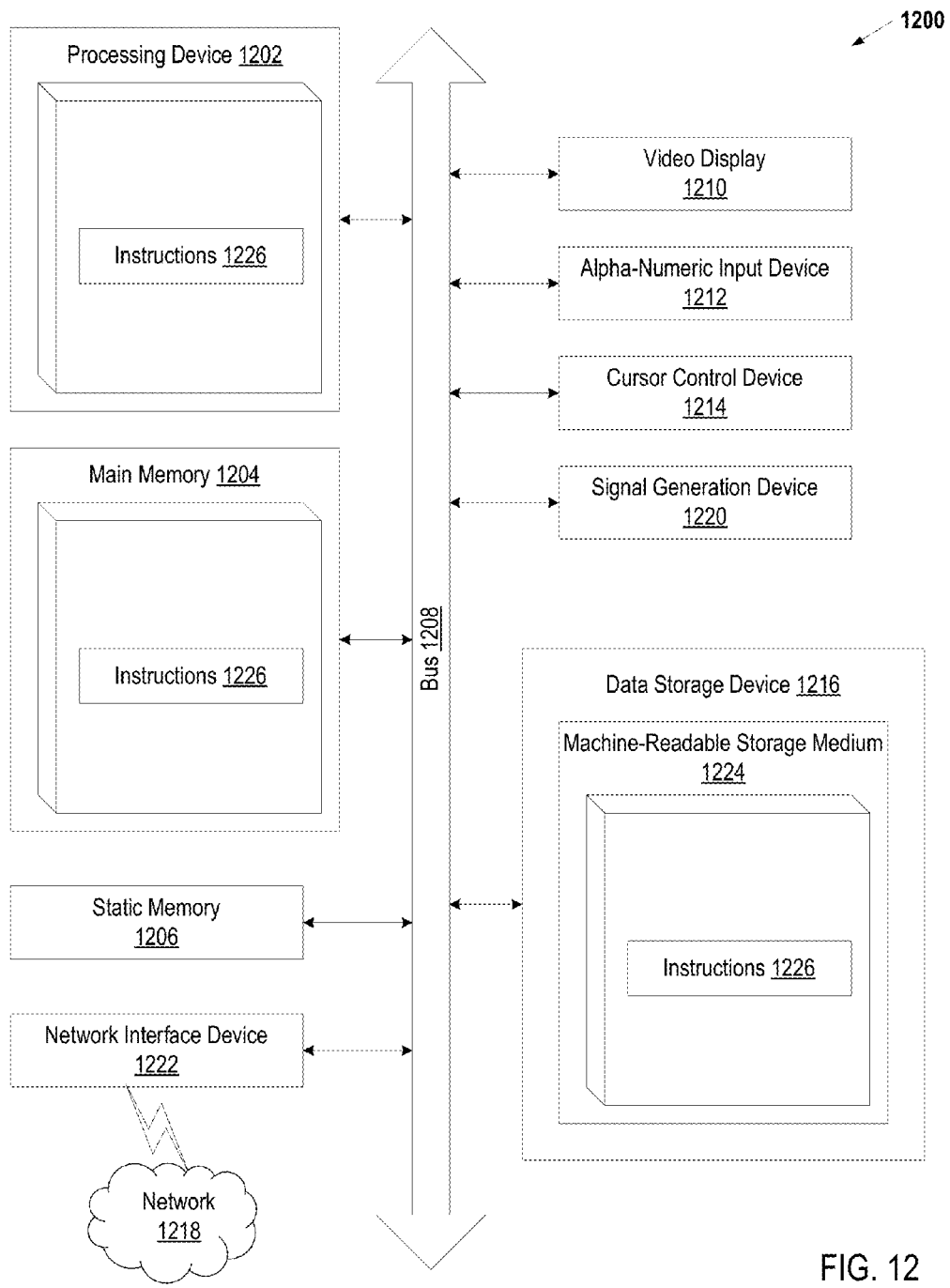
FIG. 12 is a diagram of one embodiment of a computer system for generating a recipe for a manufacturing tool.

FIG. 12 is a diagram of one embodiment of a computer system for creating a recipe for a metrology tool using design data. Within the computer system 1200 is a set of instructions for causing the machine to perform any one or more of the methodologies discussed herein. In alternative embodiments, the machine may be connected (e.g., networked) to other machines in a LAN, an intranet, an extranet, or the Internet. The machine can operate in the capacity of a server or a client machine (e.g., a client computer executing the browser and the server computer executing the automated task delegation and project management) in a client-server network environment, or as a peer machine in a peer-to-peer (or distributed) network environment. The machine may be a personal computer (PC), a tablet PC, a console device or set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 1200 includes a processing device 1202, a main memory 1204 (e.g., read-only memory (ROM), flash memory, dynamic random access memory (DRAM) such as synchronous DRAM (SDRAM) or DRAM (RDRAM), etc.), a static memory 1206 (e.g., flash memory, static random access memory (SRAM), etc.), and a secondary memory 1216 (e.g., a data storage device in the form of a drive unit, which may include fixed or removable computer-readable storage medium), which communicate with each other via a bus 1208.

Processing device 1202 represents one or more general-purpose processing devices such as a microprocessor, central processing unit, or the like. More particularly, the processing device 1202 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 1202 may also be one or more special-purpose processing devices such as an application specific integrated circuit (ASIC), a field programmable gate array (FPGA), a digital signal processor (DSP), network processor, or the like. Processing device 1202 is configured to execute the instructions 1226 for performing the operations and steps discussed herein.

The computer system 1200 may further include a network interface device 1222. The computer system 1200 also may include a video display unit 1210 (e.g., a liquid crystal display (LCD) or a cathode ray tube (CRT)) connected to the computer system through a graphics port and graphics chipset, an alphanumeric input device 1212 (e.g., a keyboard), a cursor control device 1214 (e.g., a mouse), and a signal generation device 1220 (e.g., a speaker).

The secondary memory 1216 may include a machine-readable storage medium (or more specifically a computer-readable storage medium) 1224 on which is stored one or more sets of instructions 1226 embodying any one or more of the methodologies or functions described herein. The instructions 1226 may also reside, completely or at least partially, within the main memory 1204 and/or within the processing device 1202 during execution thereof by the computer system 1200, the main memory 1204 and the processing device 1202 also constituting machine-readable storage media. The instructions 1226 may further be transmitted or received over a network 1218 via the network interface device 1222.

The computer-readable storage medium 1224 may also be used to store the instructions 1226 persistently. While the computer-readable storage medium 1224 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of the present invention. The term "computer-readable storage medium" shall accordingly be taken to include, but not be limited to, solid-state memories, and optical and magnetic media.

The instructions 1226, components and other features described herein (for example in relation to FIG. 3) can be implemented as discrete hardware components or integrated in the functionality of hardware components such as ASICS, FPGAs, DSPs or similar devices. In addition, the instructions 1226 can be implemented as firmware or functional circuitry within hardware devices. Further, the instructions 1226 can be implemented in any combination hardware devices and software components.

In the above description, numerous details are set forth. It will be apparent, however, to one skilled in the art, that the present invention may be practiced without these specific details. In some instances, well-known structures and devices are shown in block diagram form, rather than in detail, in order to avoid obscuring the present invention.

Some portions of the detailed description which follows are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "obtaining," "selecting," "generating," "identifying," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

Embodiments of the invention also relate to an apparatus for performing the operations herein. This apparatus can be specially constructed for the required purposes, or it can comprise a general purpose computer system specifically programmed by a computer program stored in the computer system. Such a computer program can be stored in a computer-readable storage medium, such as, but not limited to, any type of disk including optical disks, CD-ROMs, and magnetic-optical disks, read-only memories (ROMs), random access memories (RAMs), EPROMs, EEPROMs, magnetic or optical cards, or any type of media suitable for storing electronic instructions.

The algorithms and displays presented herein are not inherently related to any particular computer or other apparatus. Various general purpose systems can be used with programs in accordance with the teachings herein, or it may prove convenient to construct a more specialized apparatus to perform the method steps. The structure for a variety of these systems will appear from the description below. In addition, embodiments of the present invention are not described with reference to any particular programming language. It will be appreciated that a variety of programming languages can be used to implement the teachings of embodiments of the invention as described herein.

A computer-readable storage medium can include any mechanism for storing information in a form readable by a machine (e.g., a computer), but is not limited to, optical disks, Compact Disc, Read-Only Memory (CD-ROMs), and magneto-optical disks, Read-Only Memory (ROMs), Random Access Memory (RAM), Erasable Programmable Read-Only memory (EPROM), Electrically Erasable Programmable Read-Only Memory (EEPROM), magnetic or optical cards, flash memory, or the like.

Thus, a method and apparatus for creating a recipe for a manufacturing tool using design data is described. It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A computer-implemented method of creating a recipe for inspecting a specimen, the method comprising:
   directly deriving, from design data library usable for manufacturing the specimen, data informative of basic elements and hierarchical levels thereof, the derived data representing design data;
   upon selecting among the basic elements one or more basic element of interest, identifying therebetween at least one basic element that cannot be decomposed in any other basic elements among the selected basic elements, thus giving rise to at least one basic cell characterized by respective hierarchical level;
   processing the design data to extract location information and periodicity values characterizing one or more areas being, in coordinates of a top hierarchical level, periodical with respect to the at least one basic cell, wherein extracting the periodicity values is provided with no need in obtaining data from an image of the specimen; and
   processing the location information and the extracted periodicity values to generate real-size parameters for cell-to-cell inspection, thereby enabling automated creation of recipe for inspecting the specimen.

2. The method of claim 1, wherein processing the design data to extract the location information and the periodicity values comprises:
   generating at least one set of simple array cells, the set corresponding to the top hierarchical level, wherein each simple array cell comprises a repetitive pattern area with respect to the basic cell; and
   using said at least one set of simple array cells for identifying the one or more areas being, in coordinates of the top hierarchical level, periodical with respect to the at least one basic cell.

3. The method of claim 2, wherein the at least one set of simple array cells comprises at least two simple array cells each corresponding to a different basic cell.

4. The method of claim 2, further comprising identifying in coordinates of the top hierarchical level at least one first area being periodical with respect to a first basic cell and at least one second area overlapping with the at least one first area and being periodical with respect to a second basic cell, wherein generating real-size parameters for cell-to-cell inspection is provided based, at least, on periodicity values characterizing the at least one first area, periodicity values characterizing the at least one second area and parameters characterizing overlapping between the at least one first area and the at least one second area.

5. The method of claim 4 wherein the second basic cell is different from the first basic cell.

6. The method of claim 2, wherein the at least one set of simple array cells comprises at least one simple array cell characterized by hierarchical level lower than the top hierarchical level and by coordinates transformed to coordinates of the top hierarchical level.

7. The method of claim 2, wherein generating the at least one, corresponding to the top hierarchical level, set of simple array cells comprises traversing design data up to the top hierarchical level and generating for each traversed hierarchical level a set of corresponding simple array cells using a respective set generated at a previous hierarchical level, wherein at each given hierarchal level, set of corresponding simple array cells is generated by analyzing, merely, insertions of the basic cells from respective set of simple array cells generated for previous hierarchical level.

8. The method of claim 1, wherein processing the extracted periodicity values to generate real-size parameters for cell-to-cell inspection is provided in accordance with at least one criterion selected from a group constituted by: scale-factor characterizing relationship between design data and a given specimen, a given manufacturing tool, and a given manufacturing process.

9. The method of claim 1, wherein the design data usable for manufacturing the specimen are provided in GDSII format or OASIS format.

10. A system capable of creating a recipe for inspecting a specimen, the system comprising:
  a memory storing design data library usable for manufacturing the specimen;
  a processing device operatively coupled to the memory and configured to:
    directly derive, from the design data library, data informative of basic elements and hierarchical levels thereof, the derived data representing design data;
    enable selecting among the basic elements one or more basic element of interest;
    identify among the selected elements at least one basic element that cannot be decomposed in any other selected basic elements, thus giving rise to at least one basic cell characterized by respective hierarchical level;
    process the design data to extract location information and periodicity values characterizing one or more areas being, in coordinates of a top hierarchical level, periodical with respect to the at least one basic cell, wherein extracting the periodicity values is provided with no need in obtaining data from an image of the specimen; and
    process the extracted location information and periodicity values to generate real-size parameters for cell-to-cell inspection, thereby enabling automated creation of recipe for inspecting the specimen.

11. The system of claim 10, wherein the processing device is configured to process the design data to extract the location information and the periodicity values comprising:
  generating at least one set of simple array cells, the set corresponding to the top hierarchical level, wherein each simple array cell comprises a repetitive pattern area with respect to the basic cell; and
  using said at least one set of simple array cells for identifying the one or more areas being, in coordinates of the top hierarchical level, periodical with respect to the at least one basic cell.

12. The system of claim 11, wherein the at least one set of simple array cells comprises at least one simple array cell characterized by hierarchical level lower than the top hierarchical level and by coordinates transformed to coordinates of the top hierarchical level.

13. The system of claim 11, wherein the at least one set of simple array cells comprises at least two simple array cells each corresponding to a different basic cell.

14. The system of claim 11, wherein the processing device is further configured to identify in coordinates of the top hierarchical level at least one first area being periodical with respect to a first basic cell and at least one second area overlapping with the at least one first area and being, in coordinates of the top hierarchical level, periodical with respect to a second basic cell, and wherein the processing device is further configured to generate real-size parameters for cell-to-cell inspection based, at least, on periodicity values characterizing the at least one first area, periodicity values characterizing the at least one second area and parameters characterizing overlapping between the at least one first area and the at least one second area.

15. The system of claim 10, wherein processing device is configured to process the extracted periodicity values to generate real-size parameters for cell-to-cell inspection in accordance with at least one criterion selected from a group constituted by: scale-factor characterizing relationship between design data and a given specimen, a given manufacturing tool, and a given manufacturing process.

16. A non-transitory computer readable medium including instructions that, when executed by a computer, cause the computer to perform a method of creating a recipe for inspecting a specimen, the method comprising:
  directly deriving, from design data library usable for manufacturing the specimen, data informative of basic elements and hierarchical levels thereof, the derived data representing design data;
  upon selecting among the basic elements one or more basic element of interest, identifying therebetween at least one basic element that cannot be decomposed in any other basic elements among the selected basic elements, thus giving rise to at least one basic cell characterized by respective hierarchical level;
  processing the design data to extract location information and periodicity values characterizing one or more areas being, in coordinates of a top hierarchical level, periodical with respect to the at least one basic cell, wherein extracting the periodicity values is provided with no need in obtaining data from an image of the specimen; and
  processing the extracted location information and periodicity values to generate real-size parameters for cell-to-cell inspection, thereby enabling automated creation of recipe for inspecting the specimen.

17. The non-transitory computer readable medium of claim 16, wherein processing the design data to extract the location information and the periodicity values comprises:
  generating at least one set of simple array cells, the set corresponding to the top hierarchical level, wherein each simple array cell comprises a repetitive pattern area with respect to the basic cell; and using said at least one set of simple array cells for identifying the one or more areas being, in coordinates of the top hierarchical level, periodical with respect to the at least one basic cell.

18. The non-transitory computer readable medium of claim 17, wherein the at least one set of simple array cells comprises at least one simple array cell characterized by hierarchical level lower than the top hierarchical level and by coordinates transformed to coordinates of the top hierarchical level.

19. The non-transitory computer readable medium of claim 17, wherein the at least one set of simple array cells comprises at least two simple array cells each corresponding to a different basic cell.

20. The non-transitory computer readable medium of claim 17, further comprising identifying at least one first area being, in coordinates of the top hierarchical level, periodical with respect to a first basic cell and at least one second area overlapping with the at least one first area and being, in coordinates of the top hierarchical level, periodical with respect to a second basic cell, wherein generating real-size parameters for cell-to-cell inspection is provided based, at least, on periodicity values characterizing the at least one first area, periodicity values characterizing the at least one second area and parameters characterizing overlapping between the at least one first area and the at least one second area.

* * * * *